(12) United States Patent
Choi et al.

(10) Patent No.: US 12,063,836 B2
(45) Date of Patent: Aug. 13, 2024

(54) DISPLAY APPARATUS AND ELECTRONIC APPARATUS INCLUDING THE SAME

(71) Applicant: Samsung Display Co., Ltd., Yongin-si (KR)

(72) Inventors: Chungsock Choi, Yongin-si (KR); Sunyoung Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 429 days.

(21) Appl. No.: 17/543,620

(22) Filed: Dec. 6, 2021

(65) Prior Publication Data

US 2022/0181400 A1    Jun. 9, 2022

(30) Foreign Application Priority Data

Dec. 9, 2020    (KR) .................. 10-2020-0171703
Nov. 25, 2021  (KR) .................. 10-2021-0164860

(51) Int. Cl.
| | |
|---|---|
| *H10K 59/35* | (2023.01) |
| *H10K 50/844* | (2023.01) |
| *H10K 50/86* | (2023.01) |
| *H10K 59/122* | (2023.01) |
| *H10K 59/131* | (2023.01) |
| *H10K 59/40* | (2023.01) |

(52) U.S. Cl.
CPC ......... *H10K 59/353* (2023.02); *H10K 50/844* (2023.02); *H10K 50/86* (2023.02); *H10K 59/122* (2023.02); *H10K 59/131* (2023.02); *H10K 59/352* (2023.02); *H10K 59/40* (2023.02)

(58) Field of Classification Search
CPC .... H10K 59/353; H10K 50/844; H10K 50/86; H10K 59/122; H10K 59/131; H10K 59/352; H10K 59/40; H10K 50/865; H10K 59/121; H10K 59/00; H10K 59/1213; H10K 59/123
See application file for complete search history.

(56) References Cited

U.S. PATENT DOCUMENTS

| | | | |
|---|---|---|---|
| 9,692,018 B2 | 6/2017 | Cho et al. | |
| 9,985,080 B2 | 5/2018 | Choi et al. | |
| 10,770,513 B2 | 9/2020 | Chae et al. | |
| 2020/0357871 A1 | 11/2020 | Chung et al. | |
| 2020/0365664 A1* | 11/2020 | Jeon ..................... | H10K 71/421 |

FOREIGN PATENT DOCUMENTS

| | | |
|---|---|---|
| KR | 10-2016-0017388 A | 2/2016 |
| KR | 10-2016-0031108 A | 3/2016 |
| KR | 10-2018-0018942 A | 2/2018 |
| KR | 10-2020-0039866 A | 4/2020 |

\* cited by examiner

*Primary Examiner* — Mohammad A Rahman
(74) *Attorney, Agent, or Firm* — Lewis Roca Rothgerber Christie LLP

(57) ABSTRACT

A display apparatus includes: a first display area; a second display area including a transmissive area; a substrate; a plurality of first light-emitting elements over the substrate at the first display area; a plurality of second light-emitting elements over the substrate at the second display area; an optical functional layer on the plurality of first light-emitting elements, and including a hole corresponding to the second display area; a metal layer on the plurality of second light-emitting elements, and including a through portion corresponding to the transmissive area of the second display area; and a capping layer between the metal layer and the plurality of second light-emitting elements.

20 Claims, 18 Drawing Sheets

DISPLAY APPARATUS AND ELECTRONIC APPARATUS INCLUDING THE SAME

CROSS-REFERENCE TO RELATED APPLICATION

This application claims priority to and the benefit of Korean Patent Application Nos. 10-2020-0171703, filed on Dec. 9, 2020, and 10-2021-0164860, filed on Nov. 25, 2021, in the Korean Intellectual Property Office, the disclosures of which are incorporated by reference herein in their entirety.

BACKGROUND

1. Field

Aspects of one or more embodiments of the present disclosure relate to a display apparatus, and an electronic apparatus including the same.

2. Description of the Related Art

Recently, the usage of display apparatuses has diversified. In addition, as display apparatuses have become thinner and lighter, their range of use has gradually been extended.

As the area occupied by a display area in a display apparatus expands, various functions that are combined or associated with the display apparatus have been added. In order to add various functions while expanding the display area, research is being carried out on display apparatuses having a region for performing various functions as well as displaying an image inside the display area.

The above information disclosed in this Background section is for enhancement of understanding of the background of the present disclosure, and therefore, it may contain information that does not constitute prior art.

SUMMARY

One or more embodiments of the present disclosure are directed to a display apparatus including an extended display area such that an image is displayed even in an area in which an electronic component is arranged, while minimizing or reducing a performance deterioration of the electronic component, and an electronic apparatus including the display apparatus.

However, the present disclosure is not limited to the above aspects and features, and additional aspects and features will be set forth, in part, in the description which follows, and in part, will be apparent from the description, or may be learned by practicing one or more of the presented embodiments of the present disclosure.

According to one or more embodiments of the present disclosure, a display apparatus includes: a first display area; a second display area including a transmissive area; a substrate; a plurality of first light-emitting elements over the substrate at the first display area; a plurality of second light-emitting elements over the substrate at the second display area; an optical functional layer on the plurality of first light-emitting elements, and including a hole corresponding to the second display area; a metal layer on the plurality of second light-emitting elements, and including a through portion corresponding to the transmissive area of the second display area; and a capping layer between the metal layer and the plurality of second light-emitting elements.

In an embodiment, the metal layer may include at least one of manganese (Mn), titanium (Ti), molybdenum (Mo), tungsten (W), chrome (Cr), nickel (Ni), cobalt (Co), copper (Cu), aluminum (Al), chrome nitride ($CrN_x$), titanium nitride ($TiN_x$), titanium aluminum nitride ($TiAlN_x$), titanium carbide (TiC), molybdenum oxide ($MoO_x$), chrome oxide ($CrO_x$), or tungsten oxide ($WO_x$).

In an embodiment, the metal layer may overlap with at least the plurality of second light-emitting elements in a plan view.

In an embodiment, the metal layer may not overlap with the plurality of first light-emitting elements in a plan view.

In an embodiment, the capping layer may have a thickness to cause light reflected by the plurality of second light-emitting elements and light reflected by the metal layer to destructively interfere with each other.

In an embodiment, the capping layer may include an organic insulating material.

In an embodiment, each of the plurality of second light-emitting elements may include: a pixel electrode over the substrate; an opposite electrode over the pixel electrode; and an intermediate layer between the pixel electrode and the opposite electrode.

In an embodiment, the display apparatus may further include: a pixel-defining layer covering edges of each of the plurality of second light-emitting elements, and including an opening defining an emission area of a corresponding one of the plurality of second light-emitting elements.

In an embodiment, the pixel-defining layer may include a light-blocking material.

In an embodiment, the display apparatus may further include: an encapsulation layer on the metal layer, and including at least one inorganic layer, and at least one organic layer.

In an embodiment, the display apparatus may further include a light-blocking pattern layer on the encapsulation layer at the second display area, and including: a body portion including a light-blocking material; and a first opening portion and a second opening portion, each of the first opening portion and the second opening portion being adjacent to the body portion.

In an embodiment, the first opening portion of the light-blocking pattern layer may overlap with one of the plurality of second light-emitting elements in a plan view, and the second opening portion of the light-blocking pattern layer may overlap with the transmissive area of the second display area in the plan view.

In an embodiment, a width of the body portion of the light-blocking pattern layer may be less than a width of the pixel-defining layer on a virtual plane perpendicular to one surface of the substrate.

In an embodiment, the display apparatus may further include: a touch sensing layer between the encapsulation layer and the light-blocking pattern layer, and including sensing electrodes, and trace lines electrically connected to the sensing electrodes.

According to one or more embodiments of the present disclosure, an electronic apparatus includes: a display apparatus including a first display area, and a second display area having a different resolution from that of the first display area; and an electronic component overlapping with a transmissive area of the second display area. The display apparatus includes: a substrate; a plurality of first light-emitting elements over the substrate at the first display area; a plurality of second light-emitting elements over the substrate at the second display area; an optical functional layer on the plurality of first light-emitting elements, and including a hole corresponding to the second display area; a metal layer on the plurality of second light-emitting elements, and including a through portion corresponding to the transmissive area of the second display area; and a capping layer between the metal layer and the plurality of second light-emitting elements, and having a thickness to cause light reflected by the plurality of second light-emitting elements and light reflected by the metal layer to destructively interfere with each other.

In an embodiment, the capping layer may include a through portion corresponding to the transmissive area of the second display area.

In an embodiment, the metal layer may overlap with at least the plurality of second light-emitting elements, and may not overlap with the plurality of first light-emitting elements in a plan view.

In an embodiment, each of the plurality of second light-emitting elements may include: a pixel electrode over the substrate; an opposite electrode over the pixel electrode; and an intermediate layer between the pixel electrode and the opposite electrode, and the electronic apparatus may further include a pixel-defining layer covering edges of each of the plurality of second light-emitting elements, and including a light-blocking material.

In an embodiment, the electronic apparatus may further include: an encapsulation layer on the metal layer, and including at least one inorganic layer, and at least one organic layer; a touch sensing layer on the encapsulation layer, and including sensing electrodes, and trace lines electrically connected to the sensing electrodes; and a light-blocking pattern layer on the touch sensing layer at the second display area.

In an embodiment, the light-blocking pattern layer may include: a body portion including a light-blocking material; and a first opening portion and a second opening portion, each of the first opening portion and the second opening portion at least partially surrounded by the body portion. The first opening portion of the light-blocking pattern layer may overlap with one of the plurality of second light-emitting elements in a plan view, and the second opening portion of the light-blocking pattern layer may overlap with the transmissive area of the second display area in the plan view.

The above and/or other aspects and features will become more apparent and readily appreciated from the following detailed description of the example embodiments, with reference to the accompanying drawings, the claims, and their equivalents.

The various embodiments described herein may be implemented by using a system, a method, a computer program, or a combination of a system, method, and/or computer program.

BRIEF DESCRIPTION OF THE DRAWINGS

The above and other aspects and features of the present disclosure will be more clearly understood from the following detailed description of the illustrative, non-limiting example embodiments with reference to the accompanying drawings, in which.

DETAILED DESCRIPTION

Figure 1:
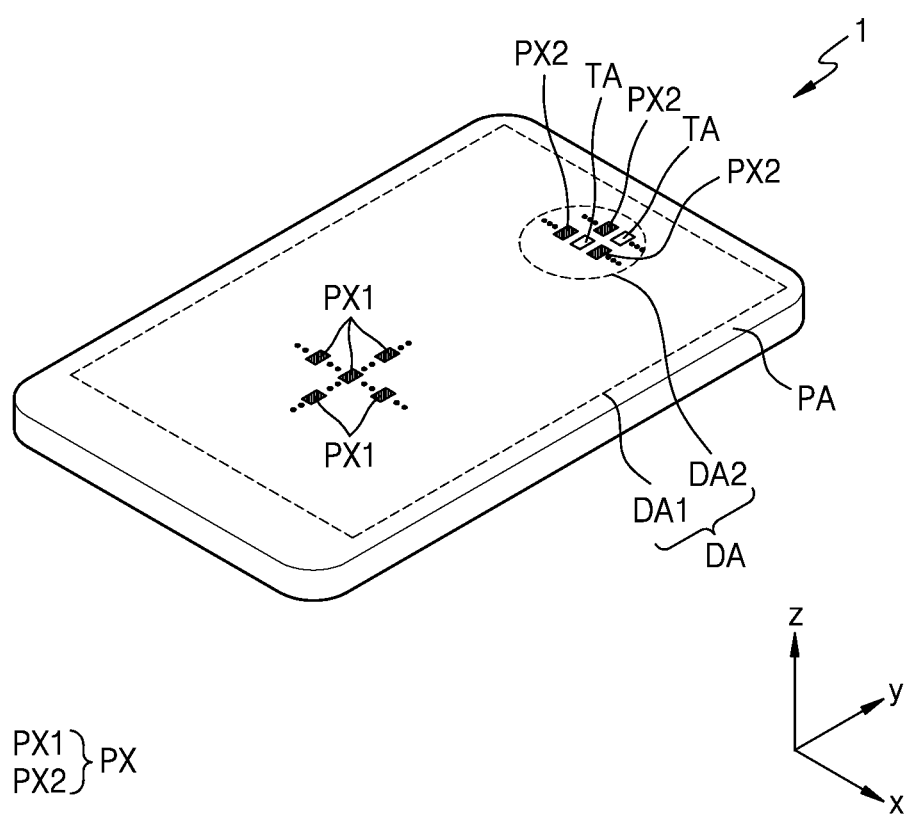
FIG. 1 is a perspective view of an electronic apparatus according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view of an electronic apparatus 1 according to an embodiment.

Referring to FIG. 1, the electronic apparatus 1 may include a display area DA, and a peripheral area PA adjacent to the display area DA. The electronic apparatus 1 may provide an image through an array of a plurality of pixels PX arranged at (e.g., in or on) the display area DA. The display area DA may include a first display area DA1 and a second display area DA2.

The plurality of pixels PX may include a plurality of first pixels PX1 and a plurality of second pixels PX2. The plurality of first pixels PX1 may be arranged at (e.g., in or on) the first display area DA1, and the plurality of second pixels PX2 may be arranged at (e.g., in or on) the second display area DA2. An array of the plurality of first pixels PX1 may be different from an array of the plurality of second pixels PX2. As an example, a transmissive area TA may be arranged between the plurality of second pixels PX2 that are arranged at (e.g., in or on) the second display area DA2. In other words, the array of the second pixels PX2 at (e.g., in or on) the second display area DA2 may have a different arrangement from that of the array of the first pixels PX1 at (e.g., in or on) the first display area DA1.

The electronic apparatus 1 may provide a first image at the first display area DA1 by using light emitted from the first pixels PX1 arranged at (e.g., in or on) the first display area DA1, and may provide a second image at the second display area DA2 by using light emitted from the second pixels PX2 arranged at (e.g., in or on) the second display area DA2. In an embodiment, the first image and the second image may be portions of one image (e.g., different portions of the same image) displayed at (e.g., in or on) the display area DA of the electronic apparatus 1. As another example, in an embodiment, the electronic apparatus 1 may provide the first image and the second image that are independent of each other.

The second display area DA2 may include the transmissive area TA arranged between the plurality of second pixels PX2. The transmissive area TA is an area through which light may pass. The second pixel PX2 is not arranged at (e.g., in or on) the transmissive area TA.

The peripheral area PA is a non-display area that does not display an image, and surrounds (e.g., around a periphery of)

the display area DA entirely or partially. A driver and/or the like may be arranged at (e.g., in or on) the peripheral area PA. The driver may be configured to provide an electrical signal and/or power to the display area DA. A pad may be arranged at (e.g., in or on) the peripheral area PA. The pad may be an area to which an electronic element, a printed circuit board, and/or the like may be electrically connected.

As shown in FIG. 1, the second display area DA2 may have a circular shape or an elliptical shape in a plan view (e.g., a view from a direction that is perpendicular to or substantially perpendicular to a top surface of the relevant element or layer). However, the present disclosure is not limited thereto. As an example, the second display area DA2 may have a suitable polygonal shape, for example, such as a quadrangle, or a bar type shape.

The second display area DA2 may be arranged within (e.g., inside) the first display area DA1, or may be arranged at (e.g., in or on) one side (e.g., one end) of the first display area DA1. As shown in FIG. 1, the second display area DA2 may be entirely surrounded (e.g., around a periphery thereof) by the first display area DA1. In an embodiment, the second display area DA2 may be partially surrounded (e.g., around a periphery thereof) by the first display area DA1. As an example, the second display area DA2 may be arranged at a corner portion at (e.g., in or on) one side (e.g., one end) of the first display area DA1, and may be partially surrounded (e.g., around a periphery thereof) by the first display area DA1.

A ratio of the second display area DA2 to the display area DA may be less than a ratio of the first display area DA1 to the display area DA. The electronic apparatus 1 may include one second display area DA2 as shown in FIG. 1, or may include two or more second display areas DA2.

While FIG. 1 shows that the electronic apparatus 1 may have a quadrangular shape having rounded corners, the present disclosure is not limited thereto. For example, the electronic apparatus 1 may have rounded corners or right-angled corners, and may have various suitable shapes, for example, such as polygons, circular shapes, elliptical shapes, and/or the like.

The electronic apparatus 1 may include (e.g., may be) various suitable portable electronic apparatuses, for example, such as mobile phones, smartphones, tablet personal computers (PC), mobile communication terminals, electronic organizers, electronic books, portable multimedia players (PMP), navigations, ultra-mobile personal computers (UMPC), and/or the like. In addition, in an embodiment, the electronic apparatus 1 may include (e.g., may be) various suitable wearable devices, for example, such as smartwatches, watchphones, glasses-type displays, head-mounted displays (HMD), and/or the like.

Hereinafter, for convenience, the electronic apparatus 1 may be described in more detail as including an organic light-emitting diode (OLED) as a light-emitting element, but the present disclosure is not limited thereto. In another embodiment, the electronic apparatus 1 may include a light-emitting display apparatus including an inorganic light-emitting diode, or in other words, an inorganic light-emitting display. The inorganic light-emitting diode may include a PN-diode including inorganic semiconductor-based materials. When a voltage is applied to the PN-junction diode in a forward direction, holes and electrons are injected, and light of a desired color (e.g., a predetermined or preset color) may be emitted by converting energy generated by recombination of holes and electrons into light energy. The inorganic light-emitting diode may have a width of several micrometers to hundreds of micrometers, or several nanometers to hundreds of nanometers. In an embodiment, the inorganic light-emitting diode may be denoted by a micro light-emitting diode. In another embodiment, the electronic apparatus 1 may include a quantum-dot light-emitting display.

Figure 2:
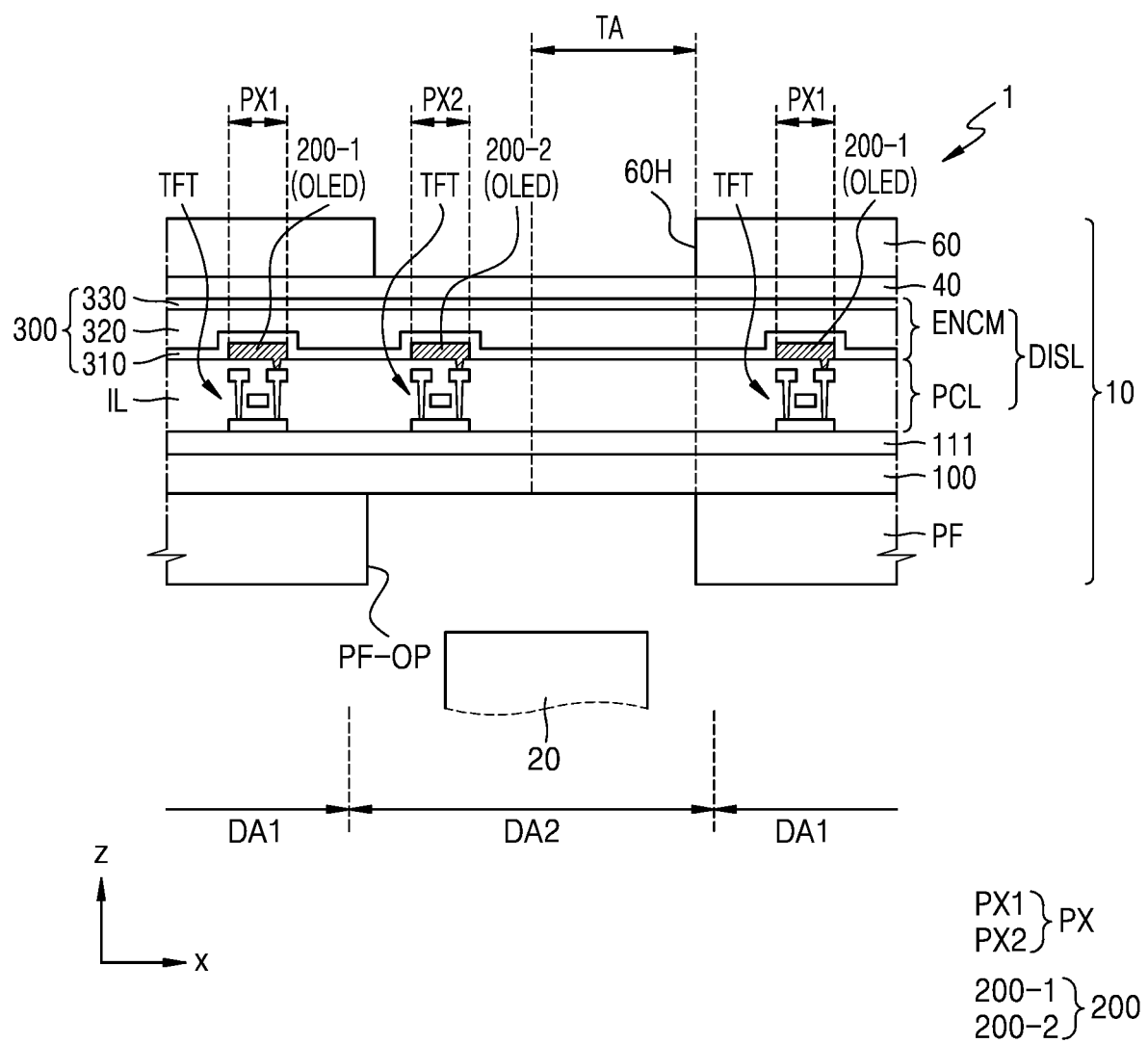
FIG. 2 is a cross-sectional view of a portion of the electronic apparatus according to an embodiment.

FIG. 2 is a cross-sectional view of a portion of the electronic apparatus 1 according to an embodiment.

Referring to FIG. 2, the electronic apparatus 1 may include a display apparatus 10, and an electronic component 20 overlapping with the display apparatus 10.

The display apparatus 10 may include the first display area DA1, and the second display area DA2. The first display area DA1 may be an area configured to display a first image, and the second display area DA2 may be an area that overlaps with the electronic component 20, and configured to display a second image.

The display apparatus 10 may include a substrate 100. The display apparatus 10 may further include a display layer DISL, a touch sensing layer 40, and an optical functional layer 60 on the substrate 100, and a bottom protective film PF under (e.g., underneath) the substrate 100. The display layer DISL may include a pixel circuit layer PCL, an organic light-emitting diode OLED, and an encapsulation member ENCM. The pixel circuit layer PCL may include a thin-film transistor TFT, and insulating layers IL. The organic light-emitting diode OLED may be provided as a light-emitting element 200, and the encapsulation member ENCM may cover the light-emitting element 200. A buffer layer 111 may be arranged between the substrate 100 and the display layer DISL.

The substrate 100 may include glass or a polymer resin. As an example, the substrate 100 including the polymer resin may have a flexible characteristic, such that the substrate may be bendable, foldable, and/or rollable. In an embodiment, the substrate 100 may have a multi-layered structure including a layer including a polymer resin, and an inorganic layer.

The light-emitting element 200 of the display layer DISL, or in other words, the organic light-emitting diode OLED, may be electrically connected to the thin-film transistor TFT. The organic light-emitting diode OLED may emit light of at least one of different colors, for example, such as a red light, a green light, or a blue light, depending on the kind of organic material included therein.

The light-emitting element 200 of the display layer DISL may emit light through an emission area. Such an emission area may be defined as a pixel PX. The pixel PX may be defined as an area that may emit, for example, such as a red light, a green light, or a blue light. The display area DA is an area that displays an image. Because an image is displayed through an array of the pixels PX, the plurality of light-emitting elements 200 may define the display area DA.

As an example, the plurality of light emitting elements 200 may include a plurality of first light-emitting elements 200-1, and a plurality of second light-emitting elements 200-2. The plurality of first light-emitting elements 200-1 may define the first display area DA1, and the plurality of second light-emitting elements 200-2 may define the second display area DA2. In more detail, an emission area from which the first light-emitting element 200-1 emits light may be defined as the first pixel PX1. An area at (e.g., in or on) which an array of the plurality of first pixels PX1 provides an image may be defined as the first display area DA1. In addition, an emission area from which the second light-emitting element 200-2 emits light may be defined as the second pixel PX2. An area at (e.g., in or on) which an array of the plurality of second pixels PX2 provides an image may be defined as the second display area DA2.

A thin-film transistor (e.g., a first thin-film transistor) TFT may be arranged at (e.g., in or on) the first display area DA1, and the thin-film transistor TFT may be electrically connected to the first light-emitting element 200-1. As an example, a thin-film transistor (e.g., a second thin-film transistor) TFT may be arranged at (e.g., in or on) the second display area DA2, and the thin-film transistor TFT may be electrically connected to the second light-emitting element 200-2 arranged at (e.g., in or on) the second display area DA2. As another example, the thin-film transistor TFT (e.g., the second thin-film transistor) may be arranged at (e.g., in or on) the peripheral area PA (e.g., see FIG. 1), instead of (e.g., and not) the second display area DA2, and the thin-film transistor TFT may be electrically connected to the second light-emitting element 200-2 arranged at (e.g., in or on) the second display area DA2.

The second display area DA2 may include the transmissive area TA. The thin-film transistor TFT and the light-emitting element 200 are not arranged at (e.g., in or on) the transmissive area TA. The transmissive area TA may be an area through which light and/or a signal emitted from the electronic component 20 or light and/or a signal incident to the electronic component 20 passes. In the display apparatus 10, a transmittance of the transmissive area TA may be 30% or more, 40% or more, 50% or more, 60% or more, 75% or more, 80% or more, 85% or more, or 90% or more.

In some embodiments, a bottom metal layer may be further arranged at (e.g., in or on) the second display area DA2. The bottom metal layer may be arranged below (e.g., underneath) the light-emitting element 200 arranged at (e.g., in or on) the second display area DA2. In the case where the thin-film transistor TFT is arranged at (e.g., in or on) the second display area DA2, the bottom metal layer may be arranged below (e.g., underneath) the thin-film transistor TFT. As an example, the bottom metal layer may be arranged between the substrate 100 and the thin-film transistor TFT. The bottom metal layer may prevent or substantially prevent light from being incident to the thin-film transistor TFT arranged at (e.g., in or on) the second display area DA2, when the light is emitted from the electronic component 20 or reflected by the electronic component 20. Accordingly, performance deterioration of the thin-film transistor TFT may be prevented or reduced.

The light-emitting element 200 may be covered by the encapsulation member ENCM, for example, such as an encapsulation layer 300 or an encapsulation substrate. In an embodiment, as shown in FIG. 2, the organic light-emitting diode OLED may be covered by the encapsulation layer 300. In an embodiment, the encapsulation layer 300 may include one or more inorganic encapsulation layers, and at least one organic encapsulation layer. As an example, the encapsulation layer 300 may include first and second inorganic encapsulation layers 310 and 330, and an organic encapsulation layer 320 therebetween.

The touch sensing layer 40 may obtain coordinate information corresponding to an external input, for example, such as a touch event. The touch sensing layer 40 may include a touch electrode, and touch wirings connected to the touch electrode. The touch sensing layer 40 may sense an external input through a self-capacitive method or a mutual capacitive method.

The touch sensing layer 40 may be formed on the encapsulation member ENCM. As another example, the touch sensing layer 40 may be separately formed on a touch substrate, and then may be connected to (e.g., coupled on or attached on) the encapsulation member ENCM through an adhesive layer, for example, such as an optically clear adhesive (OCA). In an embodiment, as shown in FIG. 2, the touch sensing layer 40 may be formed directly on the encapsulation member ENCM. In this case, the adhesive layer may not be arranged between the touch sensing layer 40 and the encapsulation member ENCM.

The optical functional layer 60 may include an anti-reflection layer. The anti-reflection layer may reduce a reflectivity of light incident toward the display apparatus 10 from the outside. In an embodiment, the optical functional layer 60 may include a polarizing film (e.g., a circular polarizing film).

In an embodiment, the optical functional layer 60 may include a hole 60H corresponding to the second display area DA2. As an example, the hole 60H may entirely correspond to (e.g., may entirely overlap with) the second display area DA2. As used herein, when elements are referred to as 'corresponding to' each other, the elements may overlap with each other when the display apparatus 10 is viewed in a direction perpendicular to or substantially perpendicular to one surface (e.g., a top surface) of the substrate 100 (e.g., in a plan view). The hole 60H may be a through-hole formed by removing (e.g., by entirely removing) a portion of the optical functional layer 60 in a thickness direction (e.g., in a z direction). Accordingly, a light transmittance of the second display area DA2, for example, the light transmittance of the transmissive area TA, may be remarkably improved. In an embodiment, a transparent material, for example, such as an optically clear resin (OCR), may fill the hole 60H.

The bottom protective film PF may be attached to the bottom surface of the substrate 100. An adhesive layer may be arranged between the bottom protective film PF and the substrate 100. In another embodiment, the bottom protective film PF may be formed directly on the bottom surface of the substrate 100. In this case, the adhesive layer may not be arranged between the bottom protective film PF and the substrate 100.

The bottom protective film PF may support and protect the substrate 100. In an embodiment, the bottom protective film PF may include an opening PF-OP corresponding to the second display area DA2. The opening PF-OP of the bottom protective film PF may be a concave portion formed by removing a portion of the bottom protective film PF in the thickness direction. In an embodiment, the opening PF-OP of the bottom protective film PF may be formed by entirely removing a portion of the bottom protective film PF in the thickness direction. In this case, as shown in FIG. 2, the opening PF-OP may have a through-hole shape. In an embodiment, the opening PF-OP of the bottom protective film PF may have a blind-hole shape by partially removing a portion of the bottom protective film PF in the thickness direction.

Because the bottom protective film PF includes the opening PF-OP, a light transmittance of the second display area DA2, for example, the light transmittance of the transmissive area TA, may be improved. The bottom protective film PF may include an organic insulating material, for example, such as polyethylene terephthalate (PET) or polyimide (PI).

The electronic component 20 may be arranged at (e.g., in or on) the second display area DA2. The electronic component 20 may be an electronic element that uses light or sound. As an example, the electronic element may be a sensor that measures a distance, for example, such as a proximity sensor, a sensor that recognizes a portion of a user's body (e.g., a fingerprint, an iris, or a face), a small lamp that outputs light, or an image sensor (e.g., a camera) that captures an image. The electronic element that uses light may use light in various suitable wavelength bands, for example, such as visible light, infrared light, or ultraviolet light. The electronic element that uses sound may use ultrasonic waves, or sound in different suitable frequency bands. In an embodiment, the electronic component 20 may include sub-components, for example, such as a light-emitter and a light-receiver. The light-emitter and the light-receiver may have an integrated structure, or a pair of a light-emitter and a light-receiver having physically separated structures may constitute (e.g., may form or may be included in) one electronic component 20.

One electronic component 20 may be arranged at (e.g., in or on) the second display area DA2, or a plurality of electronic components 20 may be arranged at (e.g., in or on) the second display area DA2. In the case where the electronic apparatus 1 includes a plurality of electronic components 20, the electronic apparatus 1 may include a number of second display areas DA2 corresponding to the number of electronic components 20. As an example, the electronic apparatus 1 may include a plurality of second display areas DA2 spaced apart from each other. In an embodiment, the plurality of electronic components 20 may be arranged at (e.g., in or on) one second display area DA2. As an example, the electronic apparatus 1 may include the second display area DA2 having a bar type shape. The plurality of electronic components 20 may be spaced apart from each other in a lengthwise direction of the second display area DA2.

Figure 3:
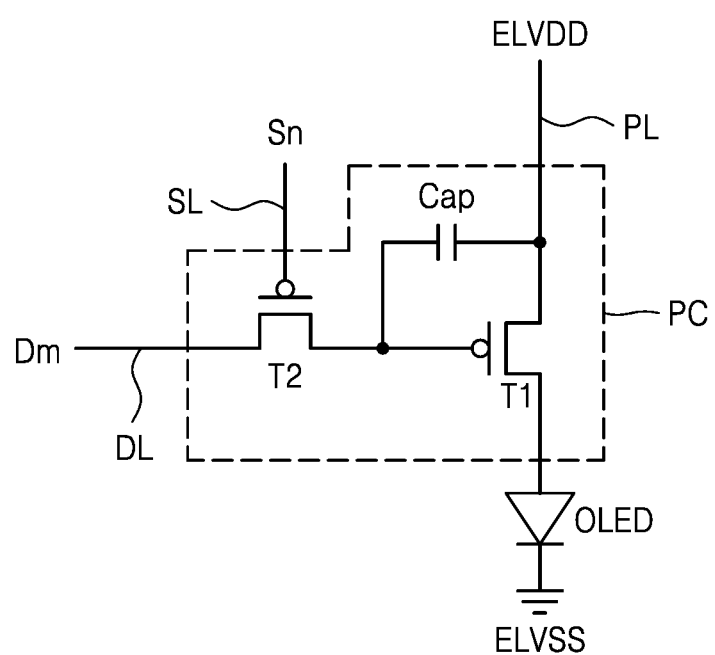
FIG. 3 is an equivalent circuit diagram of a pixel circuit of the display apparatus according to an embodiment.

FIG. 3 is an equivalent circuit diagram of a pixel circuit of the display apparatus 10 according to an embodiment.

Referring to FIG. 3, the display apparatus 10 (e.g., see FIG. 2) may include a pixel circuit PC, and the organic light-emitting diode OLED. The pixel circuit PC may be arranged at (e.g., in or on) the pixel circuit layer PCL (e.g., see FIG. 2), and the organic light-emitting diode OLED may emit light by receiving a driving current through the pixel circuit PC.

The pixel circuit PC may include a plurality of thin-film transistors TFT, and a storage capacitor Cap. In an embodiment, as shown in FIG. 3, the pixel circuit PC may include a first thin-film transistor T1, a second thin-film transistor T2, and the storage capacitor Cap. As an example, the first thin-film transistor T1 may be a driving thin-film transistor, and the second thin-film transistor T2 may be a switching thin-film transistor. The second thin-film transistor T2 may be connected to a scan line SL and a data line DL, and may be configured to transfer a data signal Dm input through the data line DL to the first thin-film transistor T1 according to a scan signal Sn input through the scan line SL.

The storage capacitor Cap may be connected to the second thin-film transistor T2 and a driving voltage line PL, and may be configured to store a voltage corresponding to a difference between a driving voltage ELVDD applied to the driving voltage line PL and a voltage (e.g., an arbitrary voltage) applied to the second thin-film transistor T2.

The first thin-film transistor T1 may be connected to the driving voltage line PL and the storage capacitor Cap, and may be configured to control the driving current flowing to the organic light-emitting diode OLED from the driving voltage line PL according to the voltage stored in the storage capacitor Cap. An opposite electrode of the organic light-emitting diode OLED is connected to a common voltage ELVSS. The organic light-emitting diode OLED may display an image by emitting light having a desired brightness (e.g., a predetermined or preset brightness) based on the driving current.

Although FIG. 3 illustrates a case where the pixel circuit PC includes two thin-film transistors and one storage capacitor, the present disclosure is not limited thereto. As an example, the pixel circuit PC may include three or more thin-film transistors, and/or two or more storage capacitors. In an embodiment, the pixel circuit PC may include seven thin-film transistors and one storage capacitor. The number of thin-film transistors and the number of storage capacitors may be variously modified depending on a design of the pixel circuit PC. However, for convenience of illustration and description, the case where the pixel circuit PC includes two thin-film transistors and one storage capacitor as shown in FIG. 3 is described in more detail below.

Figure 4A:
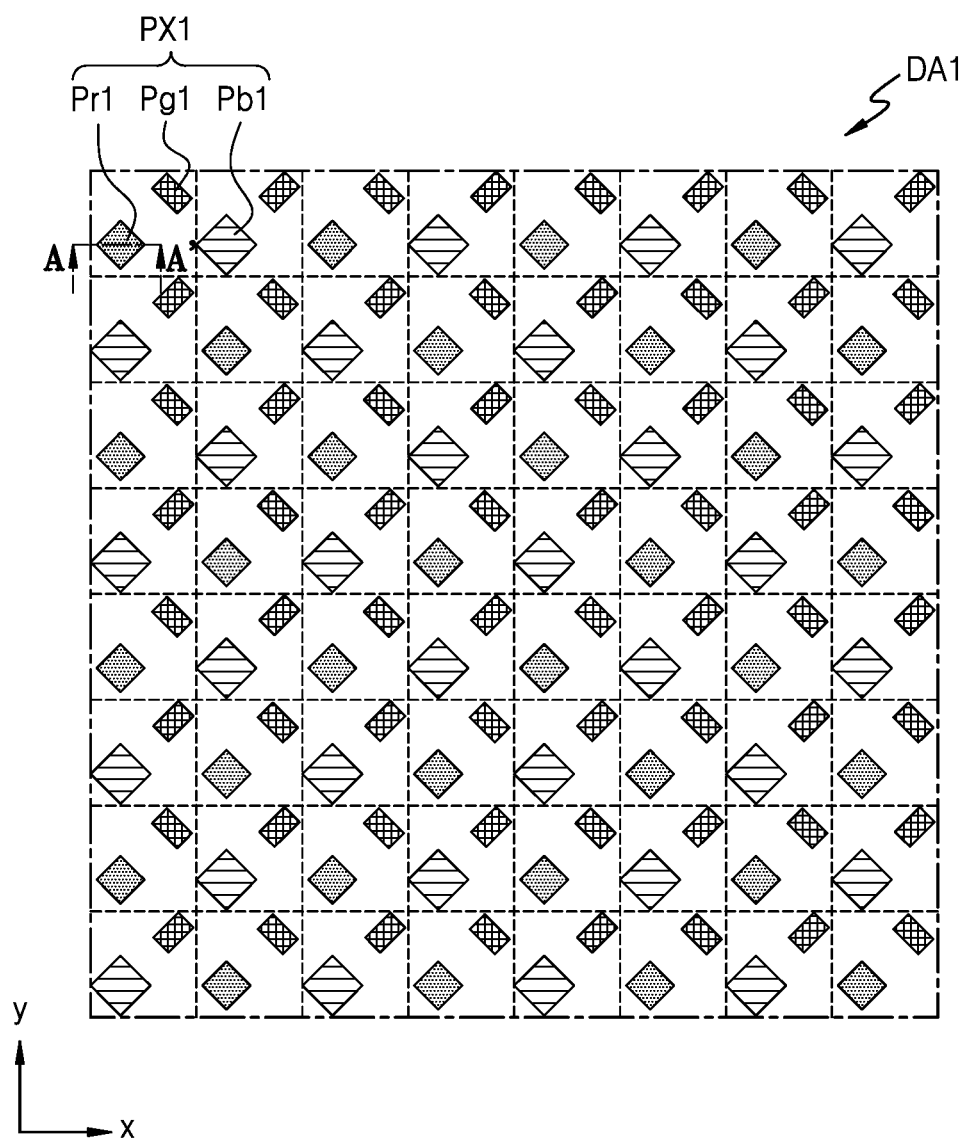
FIG. 4A is a plan view of a portion of a first display area of the display apparatus in the electronic apparatus according to an embodiment.
Figure 4B:
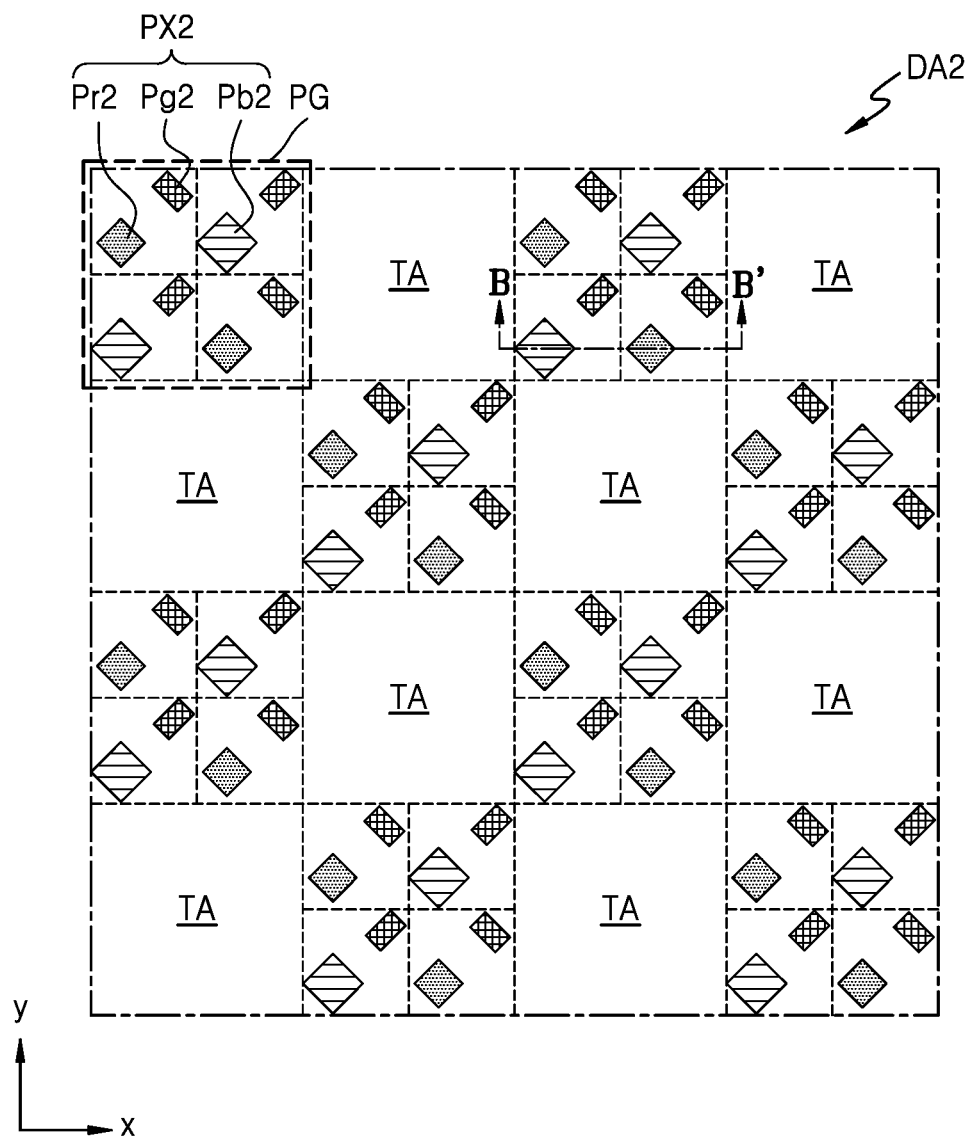
FIG. 4B is a plan view of a portion of a second display area of the display apparatus in the electronic apparatus according to an embodiment.

FIG. 4A is a plan view of a portion of the first display area DA1 of the display apparatus 10 in the electronic apparatus 1 according to an embodiment, and FIG. 4B is a plan view of a portion of the second display area DA2 of the display apparatus 10 in the electronic apparatus 1 according to an embodiment.

Referring to FIG. 4A, the first pixels PX1 may be arranged at (e.g., in or on) the first display area DA1. The first pixels PX1 may include a first red pixel Pr1, a first green pixel Pg1, and a first blue pixel Pb1. In an embodiment, as shown in FIG. 4A, the first red pixel Pr1, the first green pixel Pg1, and the first blue pixel Pb1 may be arranged in an RGBG structure or an RGBG pattern (e.g., a PENTILE® pattern, PENTILE® being a duly registered trademark of Samsung Display Co., Ltd.). In another embodiment, the first red pixel Pr1, the first green pixel Pg1, and the first blue pixel Pb1 may be arranged in a stripe pattern.

The first red pixel Pr1, the first green pixel Pg1, and the first blue pixel Pb1 may have different sizes (or widths) from each other. As an example, the first blue pixel Pb1 may have a size that is greater than those of the first red pixel Pr1 and the first green pixel Pg1. The first red pixel Pr1 may have a size that is greater than that of the first green pixel Pg1. In an embodiment, the first green pixel Pg1 may have a rectangular shape, and neighboring (e.g., adjacent ones of the) first green pixels Pg1 may extend in different directions from each other.

Referring to FIG. 4B, the second pixels PX2 may be arranged at (e.g., in or on) the second display area DA2. The second pixels PX2 may include a second red pixel Pr2, a second green pixel Pg2, and a second blue pixel Pb2. In an embodiment, the second red pixel Pr2, the second green pixel Pg2, and the second blue pixel Pb2 may be arranged in the RGBG structure or the RGBG pattern (e.g., the PENTILE® pattern). In another embodiment, the second red pixel Pr2, the second green pixel Pg2, and the second blue pixel Pb2 may be arranged in a stripe pattern.

The second display area DA2 may include the transmissive areas TA. The transmissive areas TA may be adjacent to the second pixels PX2 at (e.g., in or on) the second display area DA2. As an example, the second pixels PX2 may include at least two second pixels PX2 that are spaced apart from each other with a transmissive area TA therebetween. Because the second display area DA2 includes the transmissive area TA, the first display area DA1 and the second display area DA2 may have different resolutions from each other. As an example, the number of second pixels PX2 per an area in the second display area DA2 may be less than the number of first pixels PX1 per a same sized area in the first display area DA1.

The second display area DA2 may include a pixel group PG, and the transmissive area TA. The pixel group PG may include at least one second pixel PX2. The pixel group PG may be defined as a pixel aggregate in which a plurality of second pixels PX2 are grouped in one unit area (e.g., a predefined or preset unit area). As an example, FIG. 4B illustrates that eight second pixels PX2 constitute (e.g., form or are included in) one pixel group PG, and neighboring (e.g., adjacent) pixel groups PG are arranged from the one pixel group PG with the transmissive area TA therebetween.

As an example, one pixel group PG may be surrounded (e.g., around a periphery thereof) by four transmissive areas TA. The pixel groups PG and the transmissive areas TA may be alternately arranged along an x-direction and a y-direction. As an example, the pixel groups PG and the transmissive areas TA may be arranged in a lattice configuration.

However, the present disclosure is not limited thereto, and the number of second pixels PX2 included in one pixel group PG may be variously modified depending on the resolution of the second display area DA2. In addition, a planar shape and arrangement of the transmissive area TA around one pixel group PG may be variously modified.

The transmissive area TA is an area through which light passes. The second pixels PX2 may not be arranged at (e.g., in or on) the transmissive area TA. In addition, the pixel circuit PC (e.g., see FIG. 3) and various wirings electrically connected to the pixel circuit PC may not be arranged at (e.g., in or on) the transmissive area TA.

Figure 5A:
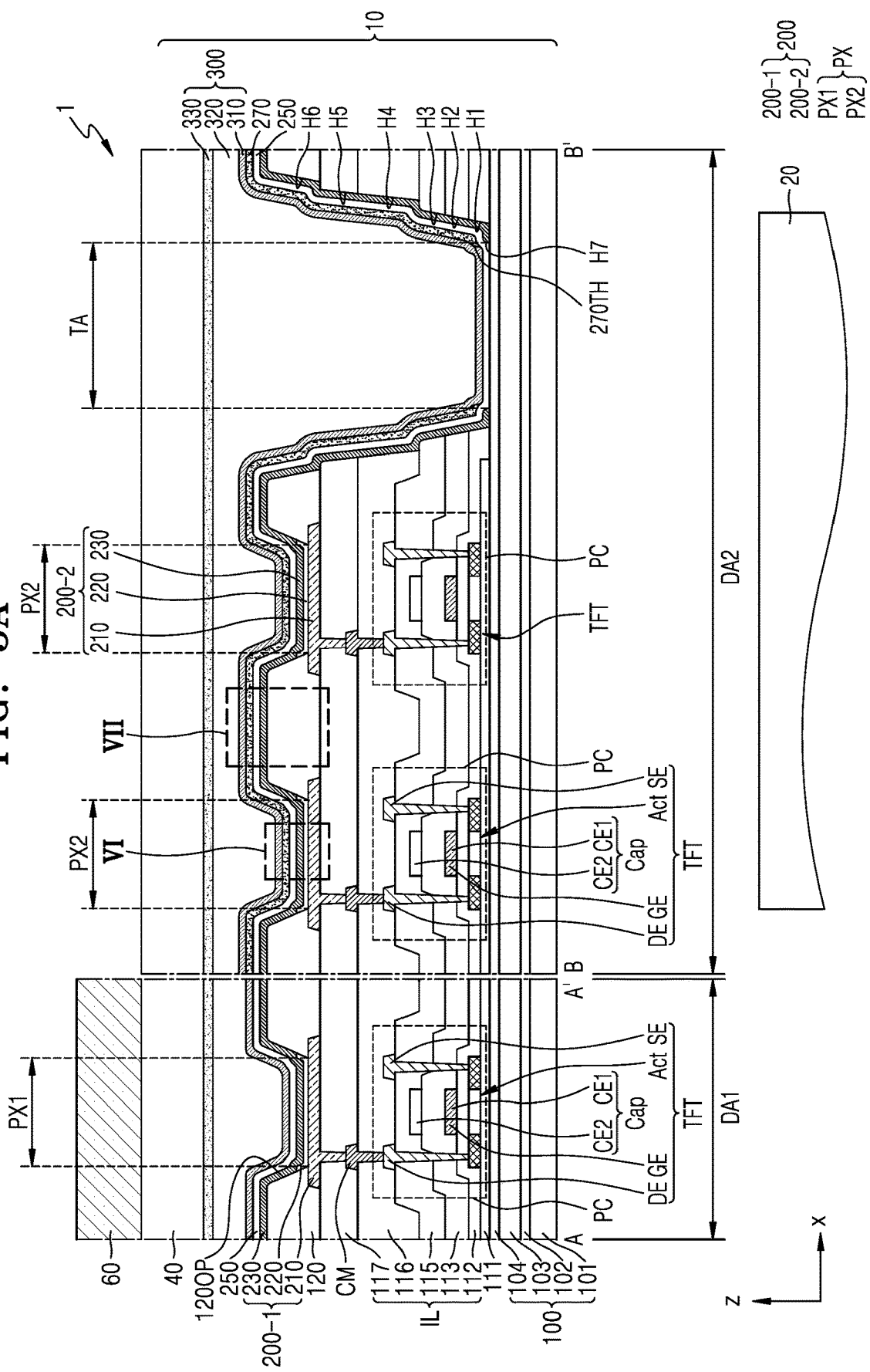
FIG. 5A is a cross-sectional view of a portion of the display apparatus of the electronic apparatus according to an embodiment.
Figure 5B:
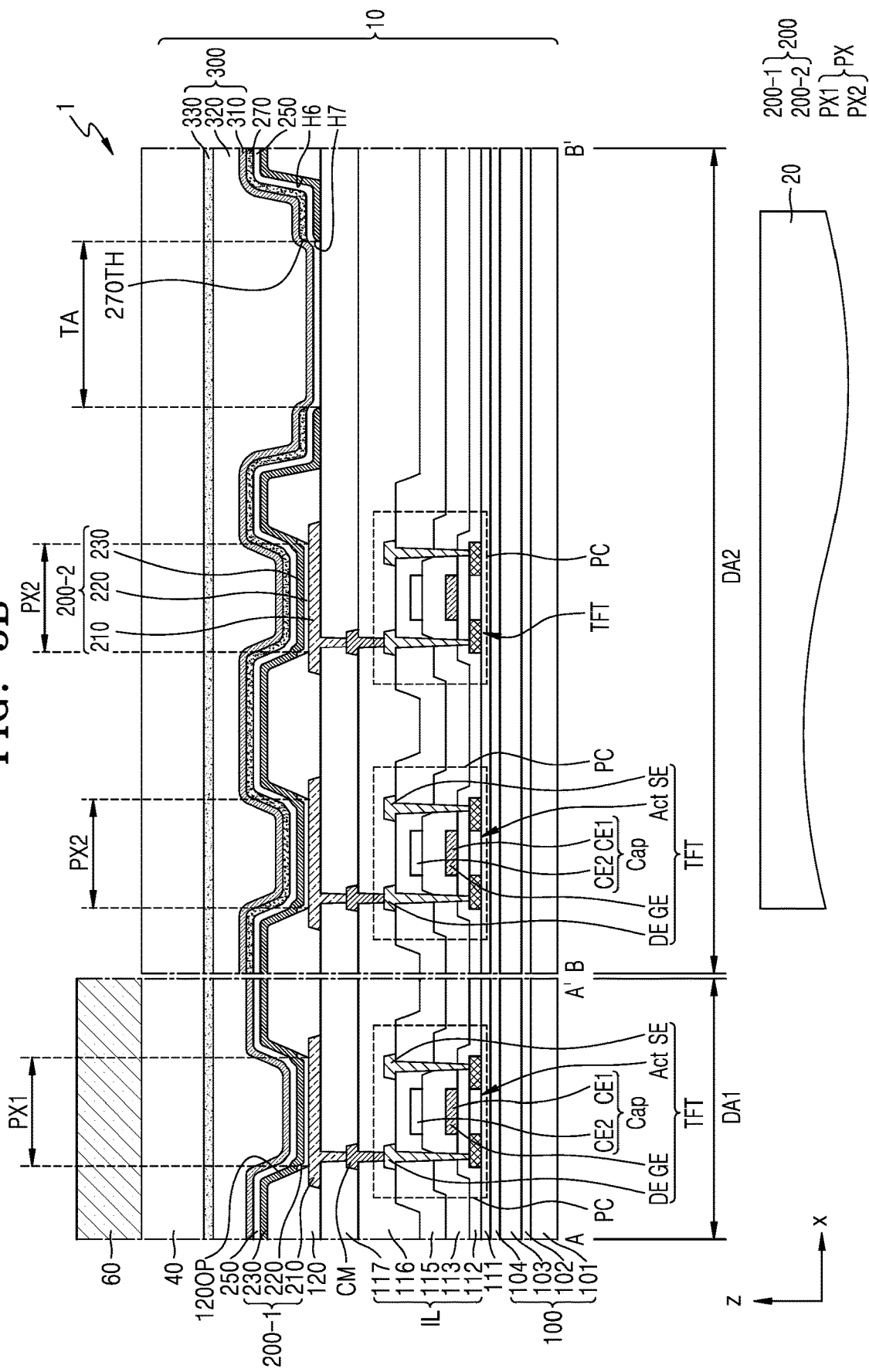
FIG. 5B is a cross-sectional view of a portion of the display apparatus of the electronic apparatus according to an embodiment.

FIGS. 5A and 5B are cross-section views of a portion of a display apparatus of an electronic apparatus according to an embodiment. FIGS. 5A and 5B may correspond to a cross-section of the display apparatus 10 taken along the line A-A' of FIG. 4A, and a cross-section of the display apparatus 10 taken along the line B-B' of FIG. 4B.

First, referring to FIG. 5A, the display apparatus 10 may include the substrate 100. In an embodiment, the substrate 100 may have a multi-layered structure including a base layer and an inorganic layer. The base layer may include a polymer resin. As an example, the substrate 100 may include a first base layer 101, a first barrier layer 102, a second base layer 103, and a second barrier layer 104 that are sequentially stacked on one another. The first base layer 101 and the second base layer 103 may include polyimide (PI), polyethersulfone (PES), polyarylate, polyetherimide (PEI), polyethylene naphthalate (PEN), polyethylene terephthalate (PET), polyphenylene sulfide (PPS), polycarbonate (PC), cellulose tri acetate (TAC), and/or cellulose acetate propionate (CAP). The first barrier layer 102 and the second barrier layer 104 may include an inorganic insulating material, for example, such as silicon oxide, silicon oxynitride, and/or silicon nitride. The substrate 100 may be flexible.

A buffer layer 111 may be arranged on the substrate 100. The buffer layer 111 may reduce or block the penetration of foreign substance, moisture, and/or external air from below the substrate 100, and may planarize or substantially planarize the top surface of the substrate 100. The buffer layer 111 may include an inorganic insulating material, for example, such as silicon oxide, silicon oxynitride, and/or silicon nitride, and may include a single-layer structure or a multi-layered structure including one or more of the above materials.

The pixel circuit layer PCL may be arranged on the buffer layer 111. The pixel circuit layer PCL may include the pixel circuit PC, and various insulating layers IL. The pixel circuit PC may include thin-film transistors TFT and the storage capacitor Cap, and the insulating layers IL may be arranged under (e.g., underneath) and/or on the elements of the pixel circuit PC.

Pixel circuits PC may be arranged at (e.g., in or on) each of the first display area DA1 and the second display area DA2. As an example, a pixel circuit (e.g., a first pixel circuit) PC of the first display area DA1 may have the same or substantially the same structure as that of a pixel circuit (e.g., a second pixel circuit) PC of the second display area DA2. As another example, the pixel circuit PC of the first display area DA1 may have a structure that is different from that of the pixel circuit PC of the second display area DA2. Hereinafter, for convenience of description, a case where the pixel circuit PC of the first display area DA1 has the same or substantially the same structure as that of the pixel circuit PC of the second display area DA2 is described in more detail, but the present disclosure is not limited thereto. The pixel circuit PC of the first display area DA1 may be mainly described in more detail hereinafter, and redundant description with regards to the pixel circuit PC of the second display area DA2 may not be repeated.

The thin-film transistor TFT of the pixel circuit PC may include a semiconductor layer Act, a gate electrode GE, a source electrode SE, and a drain electrode DE. The gate electrode GE may overlap with a channel region of the semiconductor layer Act. The source electrode SE and the drain electrode DE may be connected to a source region and a drain region, respectively, of the semiconductor layer Act.

The semiconductor layer Act may be on the buffer layer 111, and may include polycrystalline silicon. As some other examples, the semiconductor layer Act may include amorphous silicon, an oxide semiconductor, or an organic semiconductor. The semiconductor layer Act may include the channel region, the drain region, and the source region, and the drain region and the source region may be arranged at (e.g., in or on) opposite sides of the channel region. The drain region and the source region may be doped with impurities.

The gate electrode GE may include a low-resistance metal material. The gate electrode GE may include a conductive material including molybdenum (Mo), aluminum (Al), copper (Cu), and/or titanium (Ti), and may include a single layer or multi-layers including one or more of the above materials.

A first gate insulating layer 112 may be arranged between the semiconductor layer Act and the gate electrode GE. The first gate insulating layer 112 may include an inorganic insulating material including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

A second gate insulating layer 113 may cover the gate electrode GE. Similar to the first gate insulating layer 112, the second gate insulating layer 113 may include an inorganic insulating material including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

In an embodiment, the storage capacitor Cap may overlap with the thin-film transistor TFT. The storage capacitor Cap may include a first electrode CE1 and a second electrode CE2 overlapping with each other. In an embodiment, the gate electrode GE of the thin-film transistor TFT may include (e.g., may serve as) the first electrode CE1 of the storage capacitor Cap.

The second electrode CE2 of the storage capacitor Cap may be arranged on the second gate insulating layer 113. The second electrode CE2 may overlap with the gate electrode GE therebelow. In this case, the gate electrode GE, the second electrode CE2 overlapping with the gate electrode GE, and the second gate insulating layer 113 therebetween may constitute (e.g., may form or may be included in) the storage capacitor Cap. In other words, the gate electrode GE overlapping with the second electrode CE2 may serve as the first electrode CE1 of the storage capacitor Cap. In another embodiment, the storage capacitor Cap may not overlap with the thin-film transistor TFT.

The second electrode CE2 may include aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and/or copper (Cu), and may include a single layer or multi-layers including one or more of the above materials.

An interlayer insulating layer 115 may cover the second electrode CE2. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The interlayer insulating layer 115 may include a single layer or multi-layers including one or more of the inorganic insulating materials.

The drain electrode DE and the source electrode SE may be arranged on the interlayer insulating layer 115. The drain electrode DE and the source electrode SE may be connected to the drain region and the source region, respectively, through contact holes formed in the insulating layers thereunder. The drain electrode DE and the source electrode SE may include a material having a suitable conductivity (e.g., having excellent conductivity). The drain electrode DE and the source electrode SE may include a conductive material including molybdenum (Mo), aluminum (Al), copper (Cu), and/or titanium (Ti), and may include a single layer or multi-layers including one or more of the above materials. In an embodiment, the drain electrode DE and the source electrode SE may have a multi-layered structure of Ti/Al/Ti.

A first planarization insulating layer 116 may cover the drain electrode DE and the source electrode SE. The first planarization insulating layer 116 may include an organic insulating material including a general-purpose polymer, for example, such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a suitable blend thereof.

A second planarization insulating layer 117 may be arranged on the first planarization insulating layer 116. The second planarization insulating layer 117 may include the same material as that of the first planarization insulating layer 116, and may include an organic insulating material including a general-purpose polymer, for example, such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a suitable blend thereof.

The light-emitting elements 200 may be arranged on the pixel circuit layer PCL. In an embodiment, each light-emitting element 200 may be an organic light-emitting diode OLED, and may include a stacking structure including a pixel electrode 210, an opposite electrode 230, and an intermediate layer 220. The opposite electrode 230 may be arranged on the pixel electrode 210, and the intermediate layer 220 may be arranged between the pixel electrode 210 and the opposite electrode 230. As an example, the light-emitting elements 200 may include the first light-emitting elements 200-1 at (e.g., in or on) the first display area DA1 and the second light-emitting elements 200-2 at (e.g., in or on) the second display area DA2. The first light-emitting element 200-1 may emit light through a first pixel PX1. The second light-emitting element 200-2 may emit light through a second pixel PX2. As an example, the first light-emitting element 200-1 may have the same or substantially the same structure as that of the second light-emitting element 200-2. For convenience of description, the first light-emitting element 200-1 is mainly described in more detail below, and redundant description with regards to the second light-emitting element 200-2 may not be repeated.

The pixel electrode 210 may be arranged on the second planarization insulating layer 117. The pixel electrode 210 may be connected to a contact metal CM on the first planarization insulating layer 116 through a contact hole formed in the second planarization insulating layer 117. The contact metal CM may be electrically connected to the thin-film transistor TFT of the pixel circuit PC through a contact hole formed in the first planarization insulating layer 116. Accordingly, the pixel electrode 210 may be electrically connected to the pixel circuit PC through the contact metal CM, and may receive the driving current from the pixel circuit PC.

The pixel electrode 210 may include a conductive oxide, for example, such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 210 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a suitable compound thereof. In another embodiment, the pixel electrode 210 may further include a layer on and/or under the reflective layer, the layer including ITO, IZO, ZnO, or $In_2O_3$. In another embodiment, the pixel electrode 210 may have a three-layered structure of an ITO-layer/Ag-layer/ITO-layer that are sequentially stacked.

A pixel-defining layer 120 may be formed on the pixel electrode 210. The pixel-defining layer 120 may cover the edges of the pixel electrode 210, and may include an opening 1200P that overlaps with (e.g., exposes) a central portion of the pixel electrode 210. The opening 1200P may define an emission area of light emitted from the organic light-emitting diode OLED. The size/width of the opening 1200P may correspond to the size/width of the emission area. Accordingly, the size and/or width of a pixel PX may depend on the size and/or width of a corresponding opening 1200P of the pixel-defining layer 120.

The pixel-defining layer 120 may prevent or substantially prevent an arc and/or the like from occurring at the edges of the pixel electrode 210 by increasing a distance between the edges of the pixel electrode 210 and the opposite electrode 230 over the pixel electrode 210. The pixel-defining layer 120 may include an organic insulating material, for example, such as polyimide, polyamide, an acrylic resin, benzocyclobutene, hexamethyldisiloxane (HMDSO), and/or a phenolic resin, and may be formed through spin coating and/or the like.

The intermediate layer 220 may include an emission layer corresponding to the pixel electrode 210. The emission layer may include a polymer, or a low molecular weight organic material that emits light having a suitable color (e.g., a predetermined or preset color). As another example, the emission layer may include an inorganic emission material or quantum dots.

In an embodiment, the intermediate layer 220 may include a first functional layer and a second functional layer arranged under and on the emission layer, respectively. The first functional layer may be an element arranged under the emission layer, and may include, for example, a hole transport layer (HTL), or an HTL and a hole injection layer (HIL). The second functional layer may be an element arranged on the emission layer, and may include, for example, an electron transport layer (ETL) and/or an electron injection layer (EIL). Like the opposite electrode 230 as described in more detail below, the first functional layer and/or the second functional layer may be common layers that are formed to entirely cover the substrate 100.

The opposite electrode 230 may be arranged on the pixel electrode 210, and may overlap with the pixel electrode 210. The opposite electrode 230 may include a conductive material having a low work function. As an example, the opposite electrode 230 may include a transparent or semi-transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. As another example, the opposite electrode 230 may include a layer on the transparent or semi-transparent layer including one or more of the above materials, and the layer may include ITO, IZO, ZnO, or $In_2O_3$. The opposite electrode 230 may be formed as one body to entirely cover the first and second display areas DA1 and DA2.

According to an embodiment, a capping layer 250 may be provided on the light-emitting elements 200. The capping layer 250 may include an inorganic insulating material, for example, such as silicon nitride, and/or an organic insulating material. In the case where the capping layer 250 includes the organic insulating material, the capping layer 250 may include, for example, at least one of triamine derivatives, carbazole biphenyl derivatives, arylenediamine derivatives, Alq3, acryl, polyimide, and/or polyamide.

The encapsulation layer 300 may be arranged on the capping layer 250. The encapsulation layer 300 may overlap with the light-emitting element 200. As described above, the encapsulation layer 300 may include at least one inorganic encapsulation layer, and at least one organic encapsulation layer. In an embodiment, as shown in FIG. 5A, the encapsulation layer 300 may include a stacking structure of the first inorganic encapsulation layer 310, the organic encapsulation layer 320, and the second inorganic encapsulation layer 330.

The first inorganic encapsulation layer 310 and the second inorganic encapsulation layer 330 may include at least one of aluminum oxide, titanium oxide, tantalum oxide, hafnium oxide, zinc oxide, silicon oxide, silicon nitride, and/or silicon oxynitride. The organic encapsulation layer 320 may include a polymer-based material. The polymer-based material may include an acryl-based resin, an epoxy-based resin, polyimide, and/or polyethylene. In an embodiment, the organic encapsulation layer 320 may include acrylate. The organic encapsulation layer 320 may be formed by hardening a monomer or coating a polymer. The organic encapsulation layer 320 may have a suitable transparency.

The touch sensing layer 40 may be arranged on the encapsulation layer 300. The touch sensing layer 40 may include sensing electrodes, and trace lines electrically connected to the sensing electrodes. The optical functional layer 60 may be arranged on the touch sensing layer 40. As described above, the touch sensing layer 40 may obtain coordinate information corresponding to an external input, for example, such as a touch event. The optical functional layer 60 may reduce the reflectivity of light (e.g., external light) incident toward the display apparatus 10 from the outside, and/or may improve color purity of light emitted from the display apparatus 10.

In an embodiment, the optical functional layer 60 may include a retarder and/or a polarizer. The retarder may include a film-type retarder or a liquid crystal-type retarder. The retarder may include a half-wave ($\lambda/2$) retarder and/or a quarter-wave ($\lambda/4$) retarder. The polarizer may include a film-type polarizer or a liquid crystal-type polarizer. The film-type polarizer may include a stretchable synthetic resin film, and the liquid crystal-type polarizer may include liquid crystals arranged in a suitable arrangement (e.g., a predetermined arrangement). Each of the retarder and the polarizer may further include a protective film.

In another embodiment, the optical functional layer 60 may include a destructive interference structure. The destructive interference structure may include a first reflection layer, and a second reflection layer arranged at (e.g., in or on) a different layer from that of the first reflection layer. First-reflected light and second-reflected light reflected by the first reflection layer and the second reflection layer, respectively, may create destructive-interference with each other, and thus, the reflectivity of external light may be reduced.

A cover window may be arranged on the optical functional layer 60. The cover window may have a high transmittance to transmit light emitted from the light-emitting element 200, and may have a thin thickness to reduce the weight of the display apparatus 10. In addition, the cover window may have a strong strength and hardness to protect the display apparatus 10 from an external impact. The cover window may include, for example, glass or plastic.

In an embodiment, an adhesive member may be arranged between the touch sensing layer 40 and the optical functional layer 60, and between the optical functional layer 60 and the cover window. The adhesive member may include, for example, a general adhesive, a pressure sensitive adhesive (PSA), or an optically clear adhesive OCA.

Referring to the second display area DA2 of the display apparatus 10, the electronic component 20 may overlap with the second display area DA2 of the display apparatus 10. The transmissive area TA may be arranged at (e.g., in or on) the second display area DA2 of the display apparatus 10, such that light emitted from the electronic component 20 or progressing toward the electronic component 20 may be transmitted through the transmissive area TA.

Each of the insulating layers on the substrate 100 may include a hole corresponding to the transmissive area TA. As an example, the first gate insulating layer 112, the second gate insulating layer 113, the interlayer insulating layer 115, the first planarization insulating layer 116, the second planarization insulating layer 117, and the pixel-defining layer 120 may include first to sixth holes H1, H2, H3, H4, H5, and H6, respectively, that penetrate therethrough at (e.g., in or on) the transmissive area TA, and overlap with one another. In addition, the opposite electrode 230 may include a seventh hole H7 overlapping with the transmissive area TA. Accordingly, light transmittance of the transmissive area TA may be improved.

According to an embodiment, the optical functional layer 60 may be arranged on the plurality of first light-emitting elements 200-1. The optical functional layer 60 may overlap with the first display area DA1, and may not overlap with the second display area DA2. As an example, the optical functional layer 60 may include a hole 60H (e.g., see FIG. 2) corresponding to the second display area DA2.

As a comparative example, in a case where the optical functional layer 60 is arranged to overlap with the second display area DA2, light transmittance of the transmissive area TA of the second display area DA2 may be reduced (e.g., may be remarkably reduced). For example, in the case where the optical functional layer 60 includes a circular polarizing film, a transmittance of external light passing through the optical functional layer 60 may be about 45%. In this case, the performance of the electronic component 20 overlapping with the second display area DA2 may be reduced. As an example, in the case where the electronic component 20 is a photographing element, for example, such as a camera, when a light transmittance of the transmissive area TA of the second display area DA2 is low, sensitivity of the photographing element and image quality of an image photographed by the photographing element may be deteriorated.

On the other hand, according to one or more embodiments, because the optical functional layer 60 may not overlap with the second display area DA2, a loss of light transmittance of the second display area DA2 by the optical functional layer 60 may be prevented or reduced. Accordingly, light transmittance of the transmissive area TA of the second display area DA2 may be improved, and the performance of the electronic component 20 may be improved.

To improve the light transmittance of the transmissive area TA of the second display area DA2, the optical functional layer 60 may not overlap with the second display area DA2, and thus, reflectivity of external light at (e.g., in or on) the second display area DA2 may be increased.

According to an embodiment, the display apparatus 10 may include a metal layer 270 arranged at (e.g., in or on) the second display area DA2. In other words, the metal layer 270 may overlap with the second display area DA2. The metal layer 270 may be arranged over the plurality of second light-emitting elements 200-2, for example, such as between the encapsulation layer 300 and the plurality of second light-emitting elements 200-2.

In an embodiment, the metal layer 270 may overlap with the second display area DA2, and may not overlap with the first display area DA1. For example, in a plan view, the metal layer 270 may overlap with at least the plurality of second light-emitting elements 200-2, and may not overlap with the plurality of first light-emitting elements 200-1. In other words, the metal layer 270 may be arranged at (e.g., in or on) only the second display area DA2. In an embodiment, the metal layer 270 may be formed as one body at (e.g., in or on) the second display area DA2 to overlap with the plurality of second light-emitting elements 200-2. In this case, the encapsulation layer 300 may contact (e.g., may directly contact) the top surface of the capping layer 250 at (e.g., in or on) the first display area DA1, and may contact (e.g., may directly contact) the top surface of the metal layer 270 at (e.g., in or on) the second display area DA2.

In an embodiment, the metal layer 270 may include a metal material having a relatively low light reflectivity, and a relatively high light absorption. As an example, the metal layer 270 may include at least one of manganese (Mn), titanium (Ti), molybdenum (Mo), tungsten (W), chrome (Cr), nickel (Ni), cobalt (Co), copper (Cu), aluminum (Al), chrome nitride ($CrN_x$), titanium nitride ($TiN_x$), titanium aluminum nitride ($TiAlN_x$), titanium carbide (TiC), molybdenum oxide ($MoO_x$), chrome oxide ($CrO_x$), and/or tungsten oxide ($WO_x$). Accordingly, because a portion of external light that is incident to the second display area DA2 may be absorbed by the metal layer 270, external light reflectivity thereof may be reduced, and visibility that may be affected due to the external light may be improved.

In an embodiment, the metal layer 270 may include a through portion 270TH corresponding to the transmissive area TA of the second display area DA2. The through portion 270TH of the metal layer 270 may overlap with the first to sixth holes H1, H2, H3, H4, H5, and H6 of the insulating layers, and the seventh hole H7 of the opposite electrode 230. Accordingly, light transmittance of the transmissive area TA may be improved. Because the metal layer 270 includes the through portion 270TH, the encapsulation layer 300 may directly contact the top surface of the capping layer 250 at (e.g., in or on) the transmissive area TA of the second display area DA2. In the case where the capping layer 250 includes a hole corresponding to the transmissive area TA, the encapsulation layer 300 may directly contact the top surface of the buffer layer 111 at (e.g., in or on) the transmissive area TA.

According to one or more embodiments, a portion of the external light that is incident to the second display area DA2 may be absorbed by the metal layer 270, another portion of the external light may be reflected by the metal layer 270, and the rest of the external light may pass through the metal layer 270. External light that passes through the metal layer 270 may be reflected by the plurality of second light-emitting elements 200-2, for example, may be reflected by the opposite electrode 230 and/or the pixel electrode 210 of each of the plurality of second light-emitting elements 200-2. According to an embodiment, to reduce external light reflectivity of the second display area DA2, and to improve visibility that may be reduced due to the external light, the capping layer 250 may be provided between the plurality of second light-emitting elements 200-2 and the metal layer 270, such that light reflected by the plurality of second light-emitting elements 200-2 destructively interferes with light reflected by the metal layer 270. This is described in more detail below with reference to FIG. 6.

The capping layer 250 may be arranged at (e.g., in or on) the second display area DA2, as well as at (e.g., in or on) the first display area DA1. In an embodiment, the capping layer 250 may include an organic insulating material. As an example, the capping layer 250 may include an organic insulating material including triamine derivatives, carbazole biphenyl derivatives, arylenediamine derivatives, Alq3, acryl, polyimide, and/or polyamide.

Referring to FIG. 5B, the insulating layers on the substrate 100 may cover the transmissive area TA, respectively. For example, the first gate insulating layer 112, the second gate insulating layer 113, the interlayer insulating layer 115, the first planarization insulating layer 116, and the second planarization insulating layer 117 may cover the transmissive area TA. However, the pixel-defining layer 120 may include a sixth hole H6 positioned in the transmissive area TA. Also, the opposite electrode 230 may include a seventh hole H7 overlapping the transmissive area TA.

Figure 6:
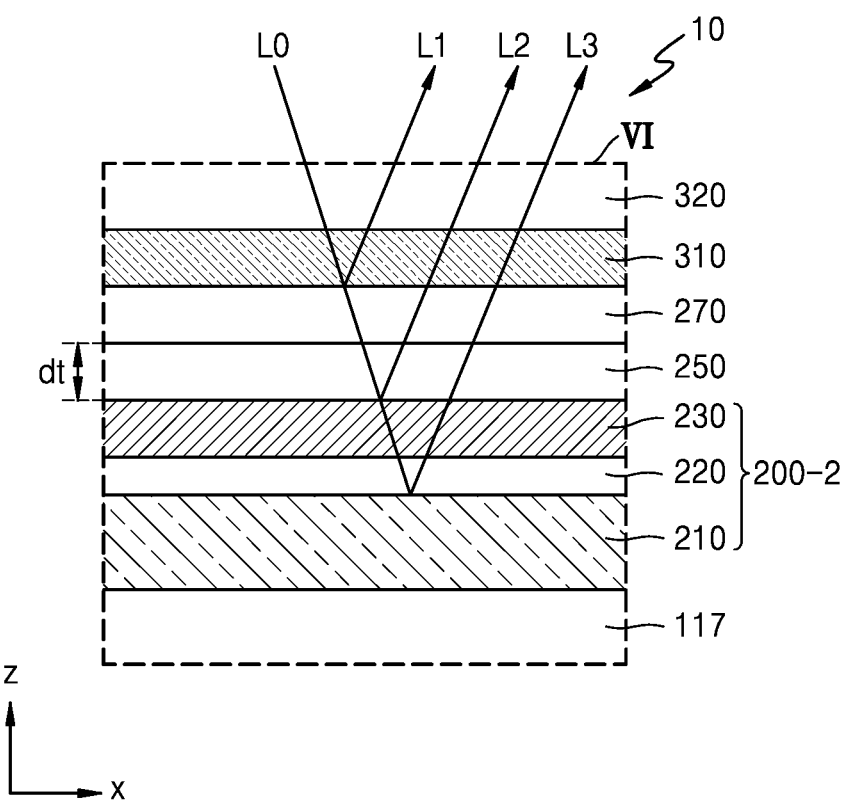
FIG. 6 is a cross-sectional view of a portion of the display apparatus of the electronic apparatus according to an embodiment.

FIG. 6 is a cross-sectional view of a portion of the display apparatus 10 of the electronic apparatus 1 according to an embodiment, and may correspond to an enlarged view of the region VI of the display apparatus of FIG. 5A.

Referring to FIG. 6, external light L0 that is incident to the display apparatus 10 from the outside may pass through the organic encapsulation layer 320 and the first inorganic encapsulation layer 310 of the encapsulation layer 300 (e.g., see FIG. 5A), and then may be reflected by the metal layer 270 and the opposite electrode 230.

According to an embodiment, first light L1 that is reflected by the metal layer 270 may destructively interfere with second light L2 that is reflected by the opposite electrode 230. Accordingly, external light reflectivity may be reduced. The capping layer 250 may be arranged between the metal layer 270 and the opposite electrode 230. The capping layer 250 may have a refractive index that is different from that of the metal layer 270. The capping layer 250 may have a suitable thickness (e.g., a predetermined or preset thickness) dt, such that a phase difference between the first light L1 reflected by the metal layer 270 and the second light L2 reflected by the opposite electrode 230 is about 180°.

In more detail, because a light path difference between the first light L1 and the second light L2 may depend on the thickness dt of the capping layer 250, a phase difference between the first light L1 and the second light L2 may be adjusted by adjusting the thickness dt of the capping layer 250. The first light L1 may destructively interfere with the second light L2 depending on the thickness dt of the capping layer 250. In other words, the thickness dt of the capping layer 250 may be determined such that the first light L1 reflected by the metal layer 270 destructively interferes with the second light L2 reflected by the opposite electrode 230.

A portion of the external light L0 incident from the outside may also be reflected by the pixel electrode 210. Accordingly, the thickness dt of the capping layer 250 may be determined such that the first light L1 reflected by the metal layer 270, the second light L2 reflected by the opposite electrode 230, and third light L3 reflected by the pixel electrode 210 destructively interfere with one another. Thus, external light reflectivity may be reduced, and visibility that may be affected by the external light may be improved.

Figure 7:
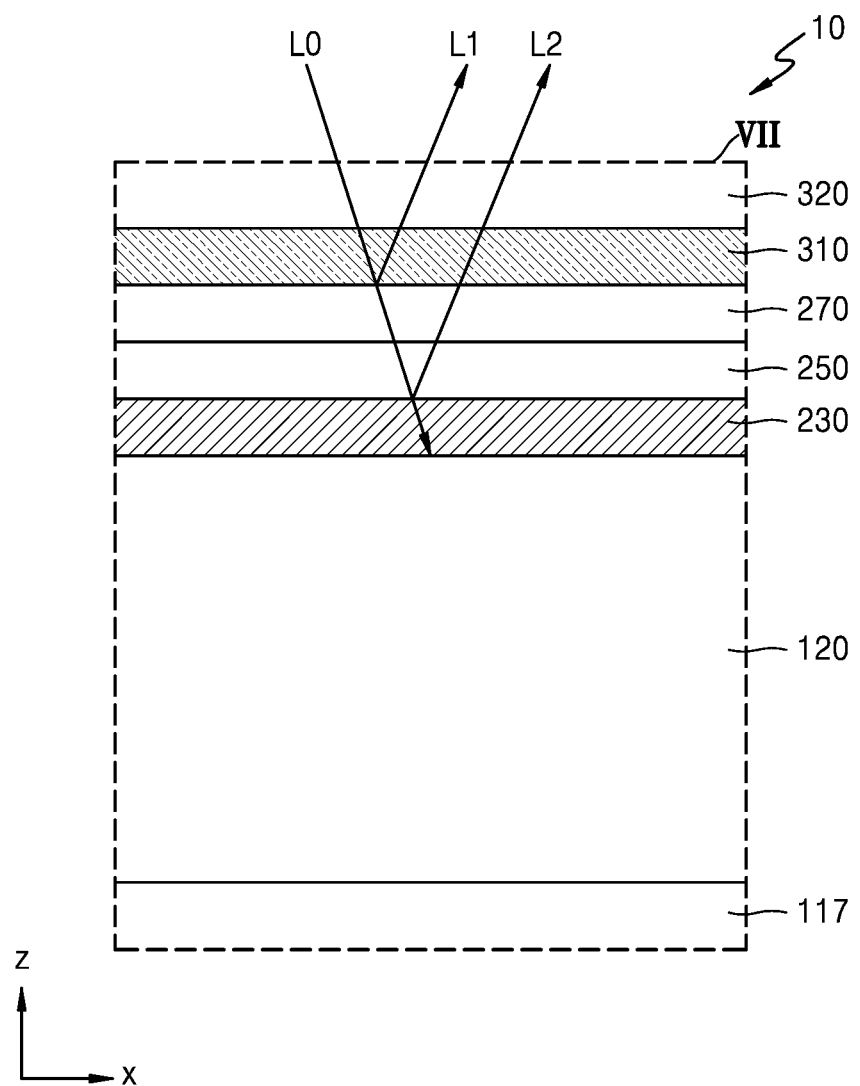
FIG. 7 is a cross-sectional view of a portion of a display apparatus of an electronic apparatus according to another embodiment.

FIG. 7 is a cross-sectional view of a portion of a display apparatus of an electronic apparatus according to another embodiment, and may correspond to an enlarged view of the region VII of the display apparatus of FIG. 5A.

Referring to FIG. 7, according to an embodiment, the pixel-defining layer 120 may additionally include a light-blocking material. The light-blocking material may include an opaque metal material including, for example, chrome (Cr) or molybdenum (Mo), black ink, and/or a dye. Accordingly, the pixel-defining layer 120 may absorb a portion of the external light L0 incident from the outside, and the external light reflectivity of the second display area DA2 may be further reduced.

Figure 8:
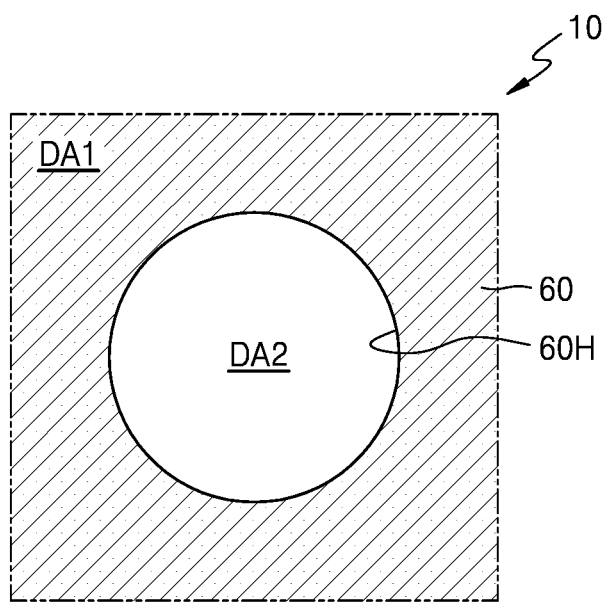
FIG. 8 is a plan view of a portion of the display apparatus of the electronic apparatus according to an embodiment.

FIG. 8 is a plan view of a portion of the display apparatus of the electronic apparatus according to an embodiment, and mainly shows a planar shape of the optical functional layer 60.

Referring to FIG. 8, the optical functional layer 60 may include a hole 60H corresponding to the second display area DA2. As an example, the hole 60H of the optical functional layer 60 may correspond to an entirety of the second display area DA2. Accordingly, the optical functional layer 60 may overlap with the first display area DA1, and may not overlap with the second display area DA2. Thus, a loss of a light transmittance at the second display area DA2 due to the optical functional layer 60 may be prevented or reduced.

In an embodiment, the hole 60H of the optical functional layer 60 may be formed by removing a portion of the optical functional layer 60 that corresponds to the hole 60H using a mechanical process, for example, such as a punching process. In another embodiment, a portion of the optical functional layer 60 that corresponds to the hole 60H may be formed to be optically transparent by using a chemical process, for example, such as a bleaching process. Accordingly, the hole 60H of the optical functional layer 60 may be formed. However, the present disclosure is not limited thereto, and any suitable method may be used without limitation as long as a portion (e.g., corresponding to the hole 60H) of the optical functional layer 60 is physically or optically removed.

In a comparative example, pattern holes may be formed in the optical functional layer 60 to correspond only to the transmissive area TA of the second display area DA2. In this case, because the size (or in other words, the area) of the pattern holes corresponding to only the transmissive area TA may be relatively small (e.g., very small), and the design of the pattern holes may be changed according to a design change of the transmissive area TA, there may be difficulty in an aspect of a process of forming the pattern holes. On the other hand, according to one or more embodiments, because the hole 60H may correspond to an entirety of the second display area DA, difficulty in the process of forming the pattern holes may be prevented or reduced.

Figure 9:
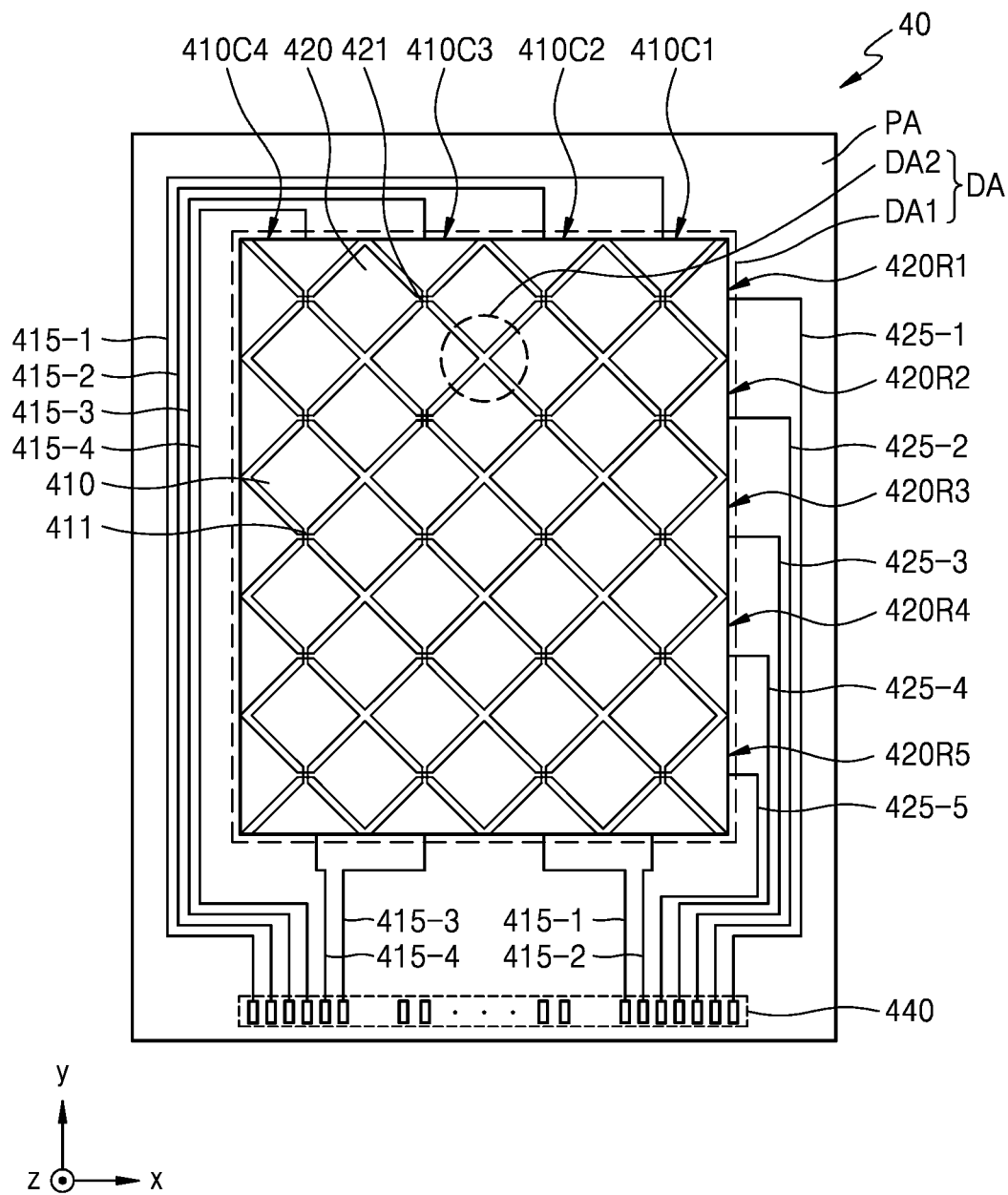
FIG. 9 is a plan view of a touch sensing layer of the display apparatus according to an embodiment.

FIG. 9 is a plan view of a touch sensing layer 40 of the display apparatus according to an embodiment.

Referring to FIG. 9, the touch sensing layer 40 may include first sensing electrodes 410, first trace lines 415-1 to 415-4 connected to the first sensing electrodes 410, second sensing electrodes 420, and second trace lines 425-1 to 425-5 connected to the second sensing electrodes 420. The first sensing electrodes 410 and the second sensing electrodes 420 may be arranged at (e.g., in or on) the display area DA. The first trace lines 415-1 to 415-4 and the second trace lines 425-1 to 425-5 may be arranged at (e.g., in or on) the peripheral area PA.

The first sensing electrodes 410 may be arranged in a ±y-direction (e.g., in a column direction), and the second sensing electrodes 420 may be arranged in a ±x-direction (e.g., in a row direction) intersecting (e.g., crossing) the ±y-direction. The first sensing electrodes 410 arranged in the ±y-direction may be connected to the each other by a first connection electrode 411 between the first sensing electrodes 410 that are adjacent to each other, and may constitute (e.g., may form or may be included in) a plurality of first sensing lines 410C1 to 410C4. The second sensing electrodes 420 arranged in the ±x-direction may be connected to the each other by a second connection electrode 421 between the second sensing electrodes 420 that are adjacent to each other, and may constitute (e.g., may form or may be included in) a plurality of second sensing lines 420R1 to 420R5. The first sensing lines 410C1 to 410C4 may cross the second sensing lines 420R1 to 420R5. As an example, the first sensing lines 410C1 to 410C4 may perpendicularly or substantially perpendicularly cross the second sensing lines 420R1 to 420R5.

The first sensing lines 410C1 to 410C4 may be connected to a pad of a sensing signal pad portion 440 through the first trace lines 415-1 to 415-4 formed at (e.g., in or on) the peripheral area PA. As an example, the first trace lines 415-1 to 415-4 may have a double routing structure in which the first trace lines 415-1 to 415-4 are connected to a top end (or a top surface) and a bottom end (or a bottom surface) of each of the first sensing lines 410C1 to 410C4. Each of the first trace lines 415-1 to 415-4 connected to the top end and the bottom end of the first sensing lines 410C1 to 410C4 may be connected a corresponding pad of the sensing signal pad portion 440.

The second sensing lines 420R1 to 420R5 may be connected to a pad of the sensing signal pad portion 440 through the second trace lines 425-1 to 425-5 formed at (e.g., in or on) the peripheral area PA. As an example, each of the second trace lines 425-1 to 425-5 may be connected to a corresponding pad of the sensing signal pad portion 440.

FIG. 9 shows a double routing structure in which the first trace lines 415-1 to 415-4 are connected to the top end and the bottom end of each of the first sensing lines 410C1 to 410C4. Such a structure may improve a sensing sensitivity (or a touch sensitivity). However, the present disclosure is not limited thereto. In another embodiment, the first trace lines 415-1 to 415-4 may have a single routing structure in which the first trace lines 415-1 to 415-4 are connected to one of the top end or the bottom end of each of the first sensing lines 410C1 to 410C4.

Figure 10:
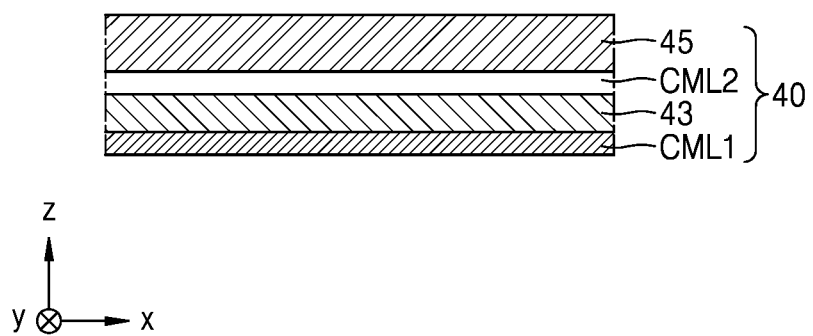
FIG. 10 is a cross-sectional view of a stacking structure of a touch sensing layer according to an embodiment.

FIG. 10 is a cross-sectional view of a stacking structure of a touch sensing layer according to an embodiment.

Referring to FIG. 10, the touch sensing layer 40 may include a first conductive layer CML1 and a second conductive layer CML2. A first insulating layer 43 may be arranged between the first conductive layer CML1 and the second conductive layer CML2. A second insulating layer 45 may be arranged on the second conductive layer CML2. The first sensing electrodes 410, the first connection electrodes 411, the second sensing electrodes 420, and the second connection electrodes 421 (e.g., see FIG. 9) may each be included at (e.g., in or on) one of the first conductive layer CML1 or the second conductive layer CML2.

The first and second conductive layers CML1 and CML2 may each include a metal layer or a transparent conductive layer. The metal layer may include at least one of molybdenum (Mo), mendelevium (Md), silver (Ag), titanium (Ti), copper (Cu), aluminum (Al), and/or an alloy thereof. The transparent conductive layer may include a transparent conductive oxide, for example, such as ITO, IZO, ZnO, or indium tin zinc oxide (ITZO). In addition, the transparent conductive layer may include a conductive polymer, for example, such as poly (3,4-ethylenedioxythiophene) (PEDOT), a metal nano wire, and/or graphene.

The first and second conductive layers CML1 and CML2 may each include a single layer or multi-layers. The first and second conductive layers CML1 and CML2 each having a single layer may include a metal layer or a transparent conductive layer. The metal layer and the transparent conductive layer are the same as those described above. One of the first and/or second conductive layers CML1 and/or CML2 may include a single metal layer. The single metal layer may include a molybdenum layer or an alloy layer of MoMd. One of the first and/or second conductive layers CML1 and/or CML2 may include a multi-layered metal layer. The multi-layered metal layer may include, for example, three layers of titanium layer/aluminum layer/titanium layer, or two layers of molybdenum layer/mendelevium layer. As another example, the multi-layered metal layer may include a metal layer and a transparent conductive layer. The first and second conductive layers CML1 and CML2 may have different stacking structures from each other or the same or substantially the same stacking structure as each other. As an example, the first conductive layer CML1 may include a metal layer, and the second conductive layer CML2 may include a transparent conductive layer. As another example, the first and second conductive layers CML1 and CML2 may include the same metal layer as each other.

The materials of the first and second conductive layers CML1 and CML2, and the arrangement of the sensing electrodes of the first and second conductive layers CML1 and CML2 may be determined by taking into account a desired sensing sensitivity. An RC delay may influence the sensing sensitivity. Because the sensing electrodes including the metal layer has a resistance that is less than that of the sensing electrodes including the transparent conductive layer, an RC value may be reduced, and thus, a charging time of a capacitor defined between the sensing electrodes may be reduced. Unlike the sensing electrodes including the metal layer, the sensing electrodes including the transparent conductive layer may not be viewed to a user, and an input area may be increased, and thus, a capacitance may be increased.

The first and second insulating layers 43 and 45 may each include an inorganic insulating material and/or an organic insulating material. The inorganic insulating material may include silicon oxide, silicon oxynitride, and/or silicon nitride, and the organic insulating material may include a polymer organic material.

Some of the first and second sensing electrodes 410 and 420 and the first and second connection electrodes 411 and 421 described above with reference to FIG. 9 may be arranged at (e.g., in or on) the first conductive layer CML1, and the others thereof may be arranged at (e.g., in or on) the second conductive layer CML2. In an embodiment, the first conductive layer CML1 may include the first connection electrode 411, and the second conductive layer CML2 may include the first and second sensing electrodes 410 and 420, and the second connection electrode 421. In another embodiment, the first conductive layer CML1 may include the first and second sensing electrodes 410 and 420 and the second connection electrodes 421, and the second conductive layer CML2 may include the first connection electrodes 411. In another embodiment, the first conductive layer CML1 may include the first sensing electrodes 410 and the first connection electrodes 411, and the second conductive layer CML2 may include the second sensing electrodes 420 and the second connection electrodes 421. In this case, because the first sensing electrodes 410 and the first connection electrodes 411 are provided at (e.g., in or on) the same layer as each other and are connected as one body, and the second sensing electrodes 420 and the second connection electrodes 421 are provided at (e.g., in or on) the same layer as each other, a contact hole may not be provided in an insulating layer between the first conductive layer CML1 and the second conductive layer CML2.

Although FIG. 10 shows that the touch sensing layer 40 includes the first conductive layer CML1, the first insulating layer 43, the second conductive layer CML2, and the second insulating layer 45, in some embodiments, a layer including an inorganic insulating material or an organic insulating material may be further arranged under (e.g., underneath) the first conductive layer CML1.

Figure 11:
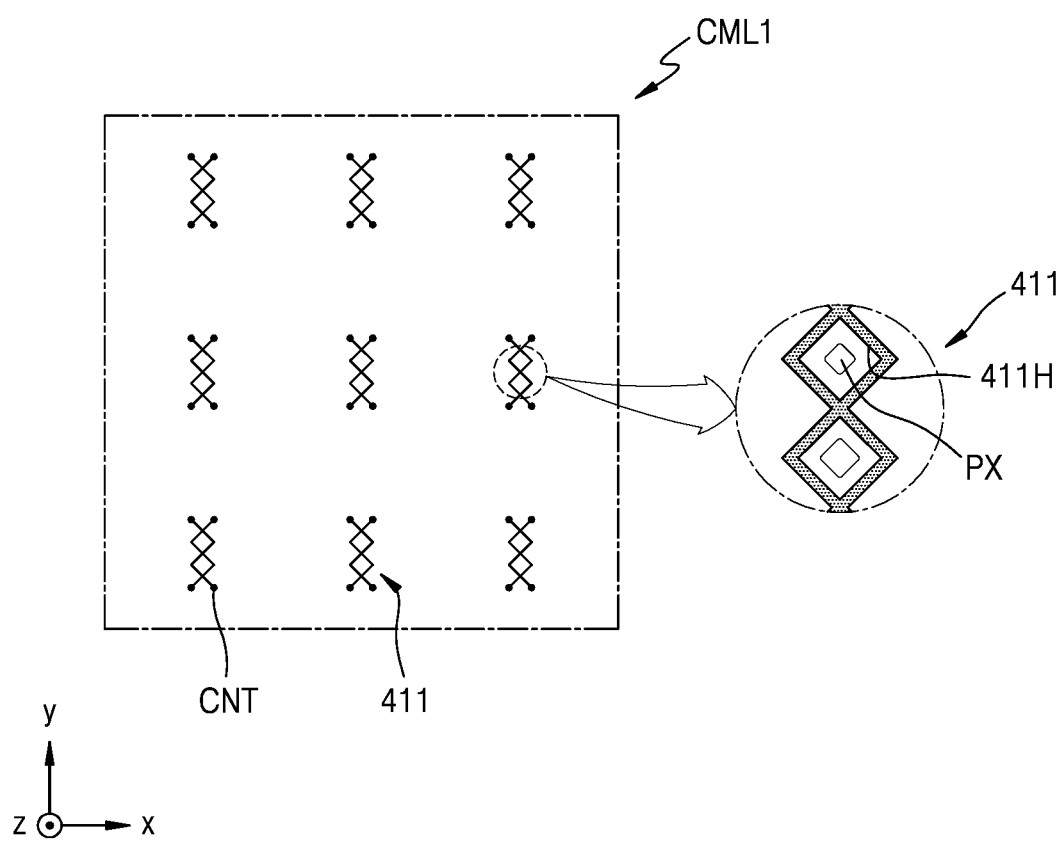
FIGS. 11-12 are plan views of a first conductive layer and a second conductive layer of a touch sensing layer according to an embodiment.
Figure 12:
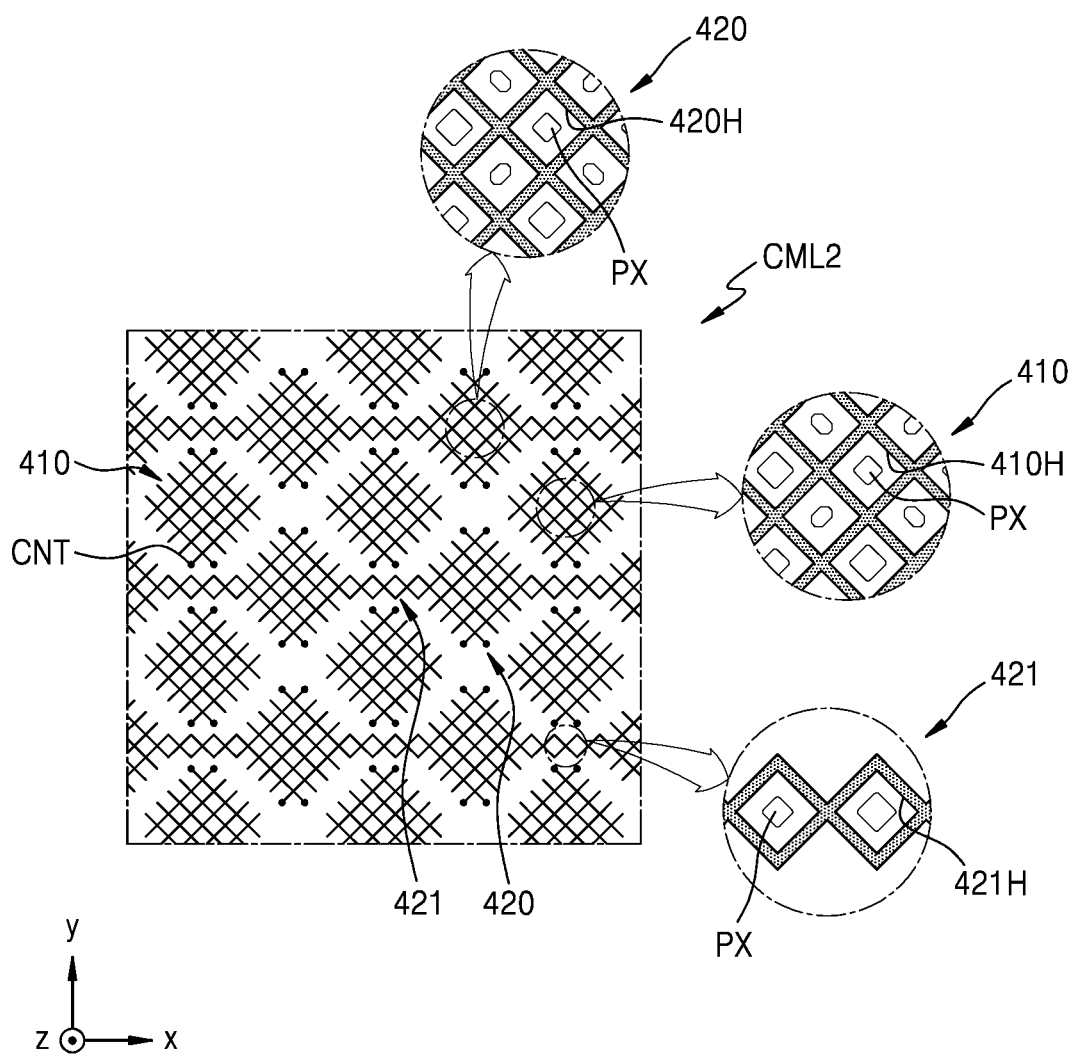

FIGS. 11 and 12 are plan views of the first conductive layer CML1 and the second conductive layer CML2 of the touch sensing layer according to an embodiment.

Referring to FIGS. 11 and 12, the first and second sensing electrodes 410 and 420 and the first and second connection electrodes 411 and 421 may have a mesh (or a grid, a lattice, and/or the like) shape. In the case where the first and second sensing electrodes 410 and 420 include a metal layer, to prevent or substantially prevent the first and second sensing electrodes 410 and 420 from being viewed to a user, and/or for transmission of light emitted through each pixel PX, the mesh shape shown in FIGS. 11 and 12 may be provided.

As shown in the enlarged views of FIGS. 11 and 12, the first and second sensing electrodes 410 and 420 may include metal layers having mesh shapes including holes 410H and 420H, respectively. Similarly, the first and second connection electrodes 411 and 421 may have metal layers, and may include holes 411H and 421H, respectively. The holes 410H, 420H, 411H, and 421H may overlap with the pixels PX.

The first conductive layer CML1 may include the first connection electrode 411 as shown in FIG. 11. The first connection electrode 411 may electrically connect the first sensing electrodes 410 to each other, which are arranged at (e.g., in or on) a layer different from that of the first connection electrode 411. The first connection electrode 411 that electrically connects neighboring (e.g., adjacent ones of the) first sensing electrodes 410 to each other may be connected to the first sensing electrodes 410 through a contact hole CNT formed in the first insulating layer 43 (e.g., see FIG. 6).

As shown in FIG. 12, the second conductive layer CML2 may include the first sensing electrodes 410, the second sensing electrodes 420, and the second connection electrode 421. The second sensing electrodes 420 may be connected to each other by the second connection electrodes 421 formed at (e.g., in or on) the same layer as that of the second sensing electrodes 420. As an example, the second sensing electrodes 420 may include the same material as that of the second connection electrodes 421, and may be formed as one body. The first sensing electrodes 410 may be electrically connected to each other by the first connection electrodes 411 formed at (e.g., in or on) a layer different from that of the first sensing electrodes 410. The first sensing electrodes 410 may be connected to the first sensing electrodes 410 through a contact hole CNT formed in the first insulating layer 43.

Figure 13:
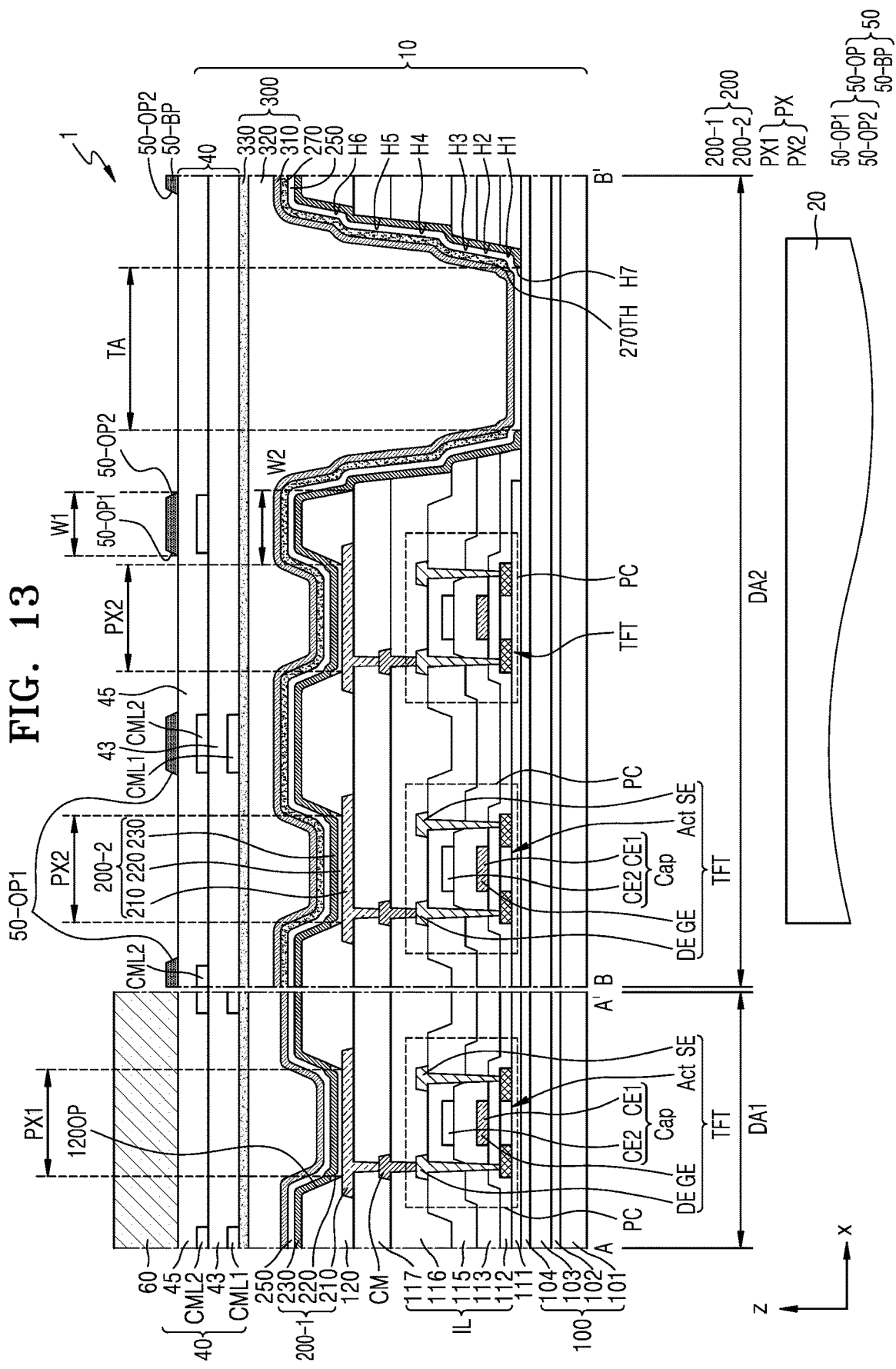
FIG. 13 is a cross-sectional view of a portion of a display apparatus of an electronic apparatus according to another embodiment.

FIG. 13 is a cross-sectional view of a portion of a display apparatus of an electronic apparatus according to another embodiment. In FIG. 13, the same or substantially the same components and layers as those of FIG. 5A are indicated with the same reference symbols, and thus, redundant description of the components and layers that are the same or substantially the same as those of FIG. 5A may not be repeated, and the differences between the embodiments of FIGS. 5A and 13 may be mainly described in more detail hereinafter.

Referring to FIG. 13, the touch sensing layer 40 may be arranged at (e.g., in or on) the first display area DA1 and the second display area DA2, and may be arranged on the encapsulation layer 300. As described above, the touch sensing layer 40 may include the first conductive layer CML1, the second conductive layer CML2, the first insulating layer 43, and the second insulating layer 45. The first insulating layer 43 may be between the first conductive layer CML1 and the second conductive layer CML2, and the second insulating layer 45 may be arranged on the second conductive layer CML2. For transmission of light emitted from the pixels PX, each of the first conductive layer CML1 and the second conductive layer CML2 may not overlap with the pixels PX, and may overlap with the pixel-defining layer 120.

According to an embodiment, the display apparatus 10 may further include a light-blocking pattern layer 50 arranged over the encapsulation layer 300 at (e.g., in or on) the second display area DA2. As an example, the light-blocking pattern layer 50 may be arranged on the touch sensing layer 40. In other words, the touch sensing layer 40 may be arranged between the encapsulation layer 300 and the light-blocking pattern layer 50. However, the present disclosure is not limited thereto. As another embodiment, the light-blocking pattern layer 50 may be arranged between the touch sensing layer 40 and the encapsulation layer 300.

In an embodiment, the light-blocking pattern layer 50 may include a body portion 50-BP, a first opening portion 50-OP1, and a second opening portion 50-OP2. The body portion 50-BP may include a light-blocking material, and the first opening portion 50-OP1 and the second opening portion 50-OP2 may be adjacent to the body portion 50-BP. The light-blocking material may include, for example, a metal material such as chrome (Cr) or molybdenum (Mo), black ink, and/or a dye. The light-blocking pattern layer 50 may additionally reduce external light reflectivity of the second display area DA2 by absorbing a portion of the external light incident from the outside. In an aspect of reduction in the external light reflectivity, the light-blocking pattern layer 50 may be arranged on the touch sensing layer 40.

In an embodiment, the body portion 50-BP of the light-blocking pattern layer 50 may overlap with the pixel-defining layer 120. The first opening portion 50-OP1 of the light-blocking pattern layer 50 may overlap with one of the plurality of second light-emitting elements 200-2. The second opening portion 50-OP2 may overlap with the transmissive area TA of the second display area DA2. Light emitted from the plurality of second light-emitting elements 200-2 may pass through the first opening portion 50-OP1. In addition, reduction in the light transmittance of the transmissive area TA may be prevented or substantially prevented by the second opening portion 50-OP2.

In an embodiment, in a virtual plane (or in other words, in a cross-sectional view) perpendicular to or substantially perpendicular to one surface of the substrate 100, a width W1 of the body portion 50-BP of the light-blocking pattern layer 50 may be equal to or less than a width W2 of the pixel-defining layer 120. Most of the light emitted from the second light-emitting elements 200-2 progresses in a direction (e.g., a (+) z-direction) that is perpendicular to or substantially perpendicular to one surface of the substrate 100, and a portion of the light may progress in a direction oblique to the (+) z-direction. In this case, when the width W1 of the body portion 50-BP of the light-blocking pattern layer 50 is greater than the width W2 of the pixel-defining layer 120, a portion of the light emitted from the second light-emitting elements 200-2 is blocked, and thus, brightness of the display apparatus 10 may be reduced. In an embodiment, however, the width W1 of the body portion 50-BP of the light-blocking pattern layer 50 may be equal to or less than the width W2 of the pixel-defining layer 120, and thus, brightness may be improved.

Figure 14:
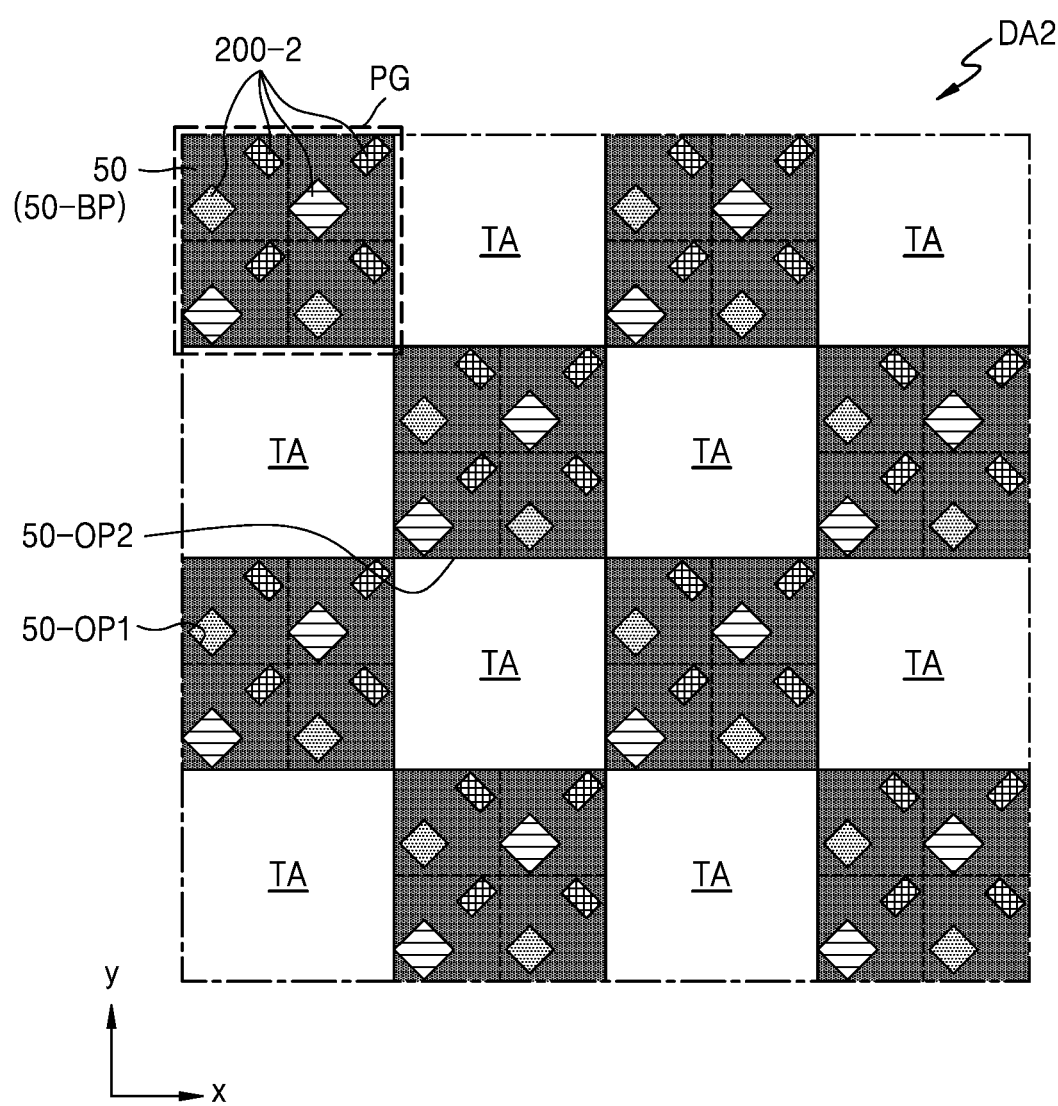
FIG. 14 is a plan view of the arrangement of a light-blocking pattern layer of a display apparatus of an electronic apparatus according to another embodiment.

FIG. 14 is a plan view of the arrangement of the light-blocking pattern layer 50 of the display apparatus 10 of the electronic apparatus 1 according to another embodiment.

Referring to FIG. 14, the first opening portion 50-OP1 and the second opening portion 50-OP2 of the light-blocking pattern layer 50 may each be at least partially surrounded (e.g., around a periphery thereof) by the body portion 50-BP of the light-blocking pattern layer 50. As an example, although FIG. 14 shows that the first opening portion 50-OP1 and the second opening portion 50-OP2 are entirely surrounded (e.g., around a periphery thereof) by the body portion 50-BP, the present disclosure is not limited thereto. Depending on the shape and the arrangement of the plurality of second light-emitting elements 200-2 at (e.g., in or on) the second display area DA2, the planar shape and the planar arrangement of the first opening portion 50-OP1 and the second opening portion 50-OP2 of the light-blocking pattern layer 50 may be variously modified.

As described above, the first opening portion 50-OP1 of the light-blocking pattern layer 50 may overlap with one of the plurality of second light-emitting elements 200-2. The second opening portion 50-OP2 may overlap with the transmissive area TA of the second display area DA2. Accordingly, light emitted from the plurality of second light-emitting elements 200-2 may pass through the first opening portion 50-OP1, and thus, reduction in the brightness may be prevented or substantially prevented. In addition, reduction in a light transmittance of external light incident through the transmissive area TA may be prevented or substantially prevented.

Figure 15:
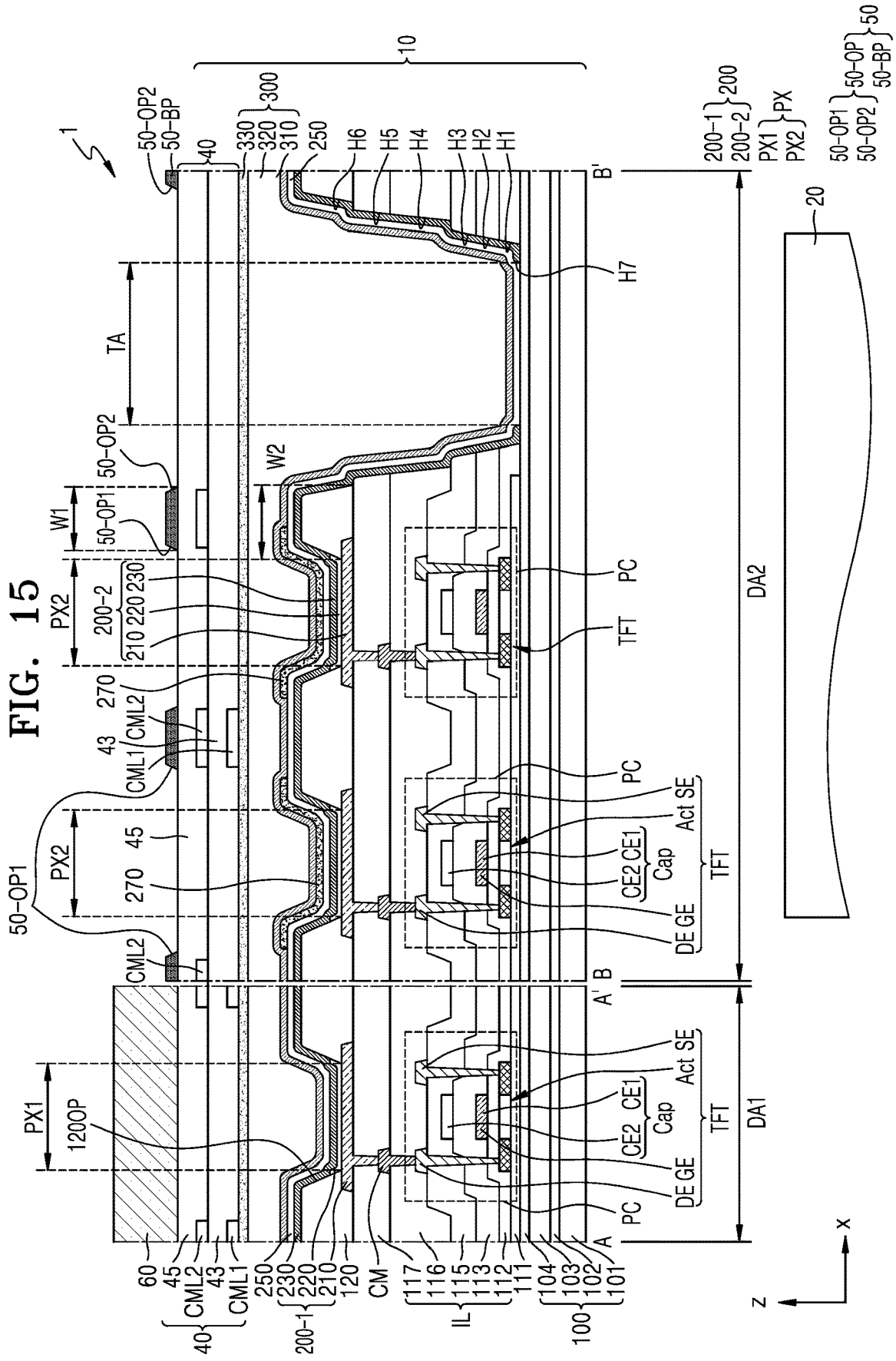
FIG. 15 is a cross-sectional view of a portion of a display apparatus of an electronic apparatus according to another embodiment.

FIG. 15 is a cross-sectional view of a portion of a display apparatus of an electronic apparatus according to another embodiment. In FIG. 15, the same or substantially the same components and layers as those of FIGS. 5 and 13 are indicated with the same reference symbols, and thus, redundant description of the components and layers that are the same or substantially the same as those of FIGS. 5 and 13 may not be repeated, and the differences between the embodiments of FIGS. 5, 13, and 15 may be mainly described in more detail hereinafter Referring to FIG. 15, the metal layer 270 may overlap with at least the plurality of second light-emitting elements 200-2 in a plan view. The metal layer 270 may be provided in a plurality. One metal layer 270 may overlap with one second light-emitting element 200-2. In other words, the plurality of metal layers 270 may not be formed as one body, and may be spaced apart from each other.

In an embodiment, each metal layer 270 may not overlap with the light-blocking pattern layer 50 in a plan view, and may correspond to the first opening portion 50-OP1 of the light-blocking pattern layer 50. In other words, to reduce the reflectivity of external light in an area that does not overlap with the light-blocking pattern layer 50, the metal layer 270 may be arranged at (e.g., in or on) an area that does not overlap with the light-blocking pattern layer 50.

In an embodiment, each metal layer 270 may have an area that is greater than the area of the opening 1200P of the pixel-defining layer 120. Here, the 'area' denotes a planar area when viewed (e.g., in a plan view) in a direction perpendicular to or substantially perpendicular to one surface of the substrate 100. In other words, the area of each metal layer 270 may be greater than the area of each second pixel PX2. In an embodiment, each metal layer 270 may have an area that is greater than or the same as the area of the pixel electrode 210 of the second light-emitting element 200-2.

Figure 16:
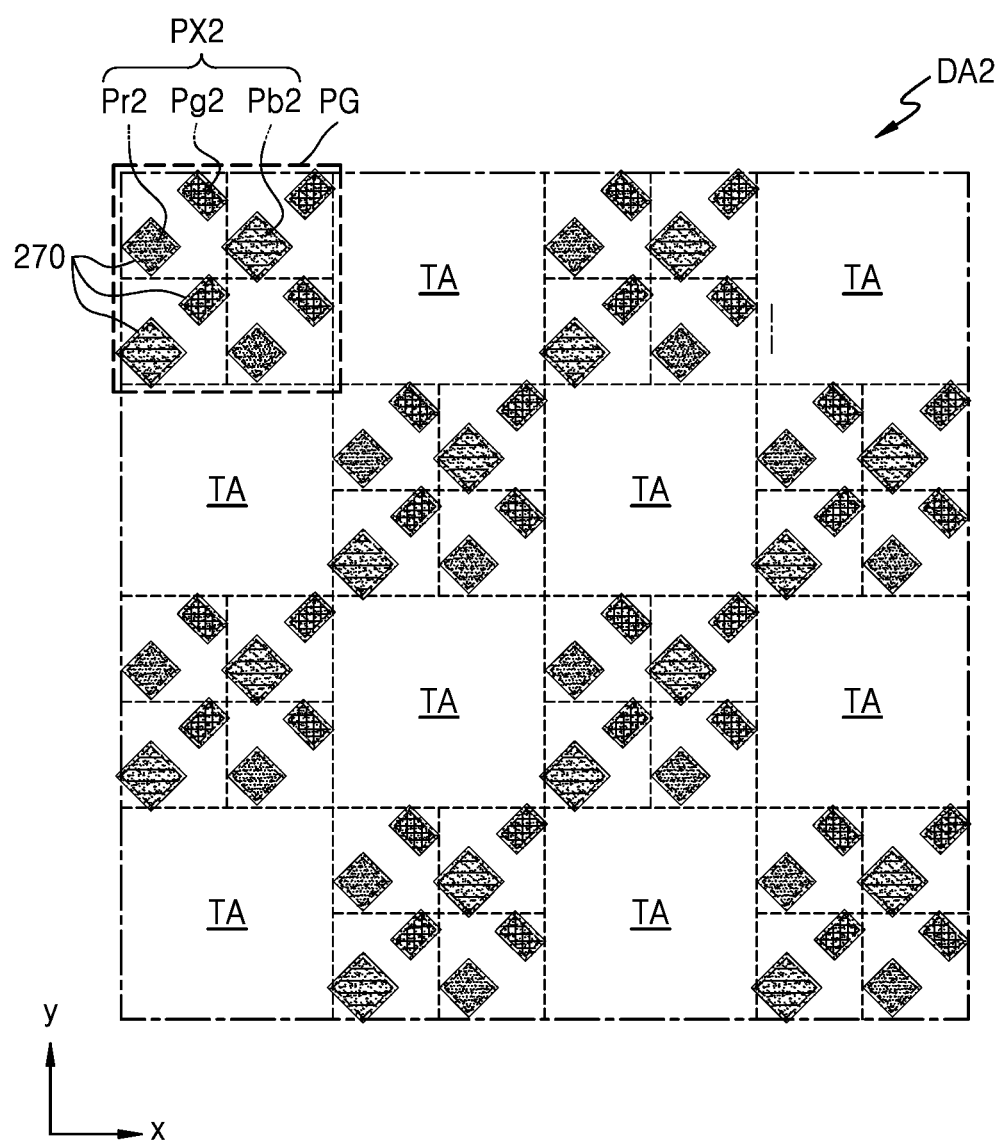
FIG. 16 is a plan view of the arrangement of the metal layer of a display apparatus of an electronic apparatus according to another embodiment.

FIG. 16 is a plan view of the arrangement of the metal layer of a display apparatus of an electronic apparatus according to another embodiment.

Referring to FIG. 16, each metal layer 270 may have an island shape or an isolated shape in a plan view. In an embodiment, each metal layer 270 may have a shape corresponding to a planar shape of the second pixel PX2. As an example, in the case where the second pixels PX2 are arranged in the RGBG pattern (e.g., the PENTILE® pattern), the metal layers 270 may be arranged in the RGBG pattern (e.g., the PENTILE® pattern). As another example, in the case where the second pixels PX2 are arranged in a stripe pattern, the metal layers 270 may be arranged in a stripe pattern. However, the present disclosure is not limited to the planar shape of the metal layer 270. In any case, the metal layers 270 may be arranged to overlap with at least the second pixel PX2. Accordingly, external light reflectivity in the second pixel PX2 that does not overlap with the light-blocking pattern layer 50 (e.g., see FIG. 15) may be reduced.

Although the above description has been focused on the display apparatus and the electronic apparatus including the same, the present disclosure is not limited thereto. As an example, a method of manufacturing the display apparatus and the electronic apparatus including the same may also fall within the scope of the present disclosure.

According to one or more embodiments, the display apparatus including the second area that displays an image, and in which the electronic component is arranged, and the electronic apparatus including the display apparatus, may be provided. Furthermore, because an optical functional layer may include the hole corresponding to the second display area, a transmittance of the second display area may be improved, and the performance of the electronic component may be improved. In addition, external light reflectivity of the second display area may be reduced, and external light visibility may be improved through the capping layer and the metal layer, which may each be arranged at (e.g., in or on) the second display area. However, the aspects and features of the present disclosure are not limited thereto.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A display apparatus comprising:
   a first display area;
   a second display area comprising a transmissive area;
   a substrate;
   a plurality of first light-emitting elements over the substrate at the first display area;
   a plurality of second light-emitting elements over the substrate at the second display area;
   an optical functional layer on the plurality of first light-emitting elements, and including a hole corresponding to the second display area;
   a metal layer on the plurality of second light-emitting elements, and including a through portion corresponding to the transmissive area of the second display area; and
   a capping layer between the metal layer and the plurality of second light-emitting elements.

2. The display apparatus of claim 1, wherein the metal layer comprises at least one of manganese (Mn), titanium (Ti), molybdenum (Mo), tungsten (W), chrome (Cr), nickel (Ni), cobalt (Co), copper (Cu), aluminum (Al), chrome nitride ($CrN_x$), titanium nitride ($TiN_x$), titanium aluminum nitride ($TiAlN_x$), titanium carbide (TiC), molybdenum oxide ($MoO_x$), chrome oxide ($CrO_x$), or tungsten oxide ($WO_x$).

3. The display apparatus of claim 1, wherein the metal layer overlaps with at least the plurality of second light-emitting elements in a plan view.

4. The display apparatus of claim 1, wherein the metal layer does not overlap with the plurality of first light-emitting elements in a plan view.

5. The display apparatus of claim 1, wherein the capping layer has a thickness to cause light reflected by the plurality of second light-emitting elements and light reflected by the metal layer to destructively interfere with each other.

6. The display apparatus of claim 1, wherein the capping layer comprises an organic insulating material.

7. The display apparatus of claim 1, wherein each of the plurality of second light-emitting elements comprises:
  a pixel electrode over the substrate;
  an opposite electrode over the pixel electrode; and
  an intermediate layer between the pixel electrode and the opposite electrode.

8. The display apparatus of claim 7, further comprising:
  a pixel-defining layer covering edges of each of the plurality of second light-emitting elements, and including an opening defining an emission area of a corresponding one of the plurality of second light-emitting elements.

9. The display apparatus of claim 8, wherein the pixel-defining layer comprises a light-blocking material.

10. The display apparatus of claim 8, further comprising:
  an encapsulation layer on the metal layer, and comprising at least one inorganic layer, and at least one organic layer.

11. The display apparatus of claim 10, further comprising a light-blocking pattern layer on the encapsulation layer at the second display area, and comprising:
  a body portion comprising a light-blocking material; and
  a first opening portion and a second opening portion, each of the first opening portion and the second opening portion being adjacent to the body portion.

12. The display apparatus of claim 11, wherein the first opening portion of the light-blocking pattern layer overlaps with one of the plurality of second light-emitting elements in a plan view, and
  wherein the second opening portion of the light-blocking pattern layer overlaps with the transmissive area of the second display area in the plan view.

13. The display apparatus of claim 11, wherein a width of the body portion of the light-blocking pattern layer is less than a width of the pixel-defining layer on a virtual plane perpendicular to one surface of the substrate.

14. The display apparatus of claim 11, further comprising:
  a touch sensing layer between the encapsulation layer and the light-blocking pattern layer, and comprising sensing electrodes, and trace lines electrically connected to the sensing electrodes.

15. An electronic apparatus comprising:
  a display apparatus comprising a first display area, and a second display area having a different resolution from that of the first display area; and
  an electronic component overlapping with a transmissive area of the second display area,
  wherein the display apparatus comprises:
    a substrate;
    a plurality of first light-emitting elements over the substrate at the first display area;
    a plurality of second light-emitting elements over the substrate at the second display area;
    an optical functional layer on the plurality of first light-emitting elements, and including a hole corresponding to the second display area;
    a metal layer on the plurality of second light-emitting elements, and including a through portion corresponding to the transmissive area of the second display area; and
    a capping layer between the metal layer and the plurality of second light-emitting elements, and having a thickness to cause light reflected by the plurality of second light-emitting elements and light reflected by the metal layer to destructively interfere with each other.

16. The electronic apparatus of claim 15, wherein the capping layer includes a through portion corresponding to the transmissive area of the second display area.

17. The electronic apparatus of claim 15, wherein the metal layer overlaps with at least the plurality of second light-emitting elements, and does not overlap with the plurality of first light-emitting elements in a plan view.

18. The electronic apparatus of claim 15, wherein each of the plurality of second light-emitting elements comprises:
  a pixel electrode over the substrate;
  an opposite electrode over the pixel electrode; and
  an intermediate layer between the pixel electrode and the opposite electrode, and
  wherein the electronic apparatus further comprises a pixel-defining layer covering edges of each of the plurality of second light-emitting elements, and comprising a light-blocking material.

19. The electronic apparatus of claim 18, further comprising:
  an encapsulation layer on the metal layer, and comprising at least one inorganic layer, and at least one organic layer;
  a touch sensing layer on the encapsulation layer, and comprising sensing electrodes, and trace lines electrically connected to the sensing electrodes; and
  a light-blocking pattern layer on the touch sensing layer at the second display area.

20. The electronic apparatus of claim 19, wherein the light-blocking pattern layer comprises:
  a body portion comprising a light-blocking material; and
  a first opening portion and a second opening portion, each of the first opening portion and the second opening portion at least partially surrounded by the body portion,
  wherein the first opening portion of the light-blocking pattern layer overlaps with one of the plurality of second light-emitting elements in a plan view, and
  wherein the second opening portion of the light-blocking pattern layer overlaps with the transmissive area of the second display area in the plan view.

* * * * *